US012660275B2

(12) United States Patent
Lee et al.

(10) Patent No.: US 12,660,275 B2
(45) Date of Patent: Jun. 16, 2026

(54) METHOD OF MANUFACTURING SEMICONDUCTOR DEVICE

(71) Applicant: Samsung Electronics Co., Ltd., Suwon-si (KR)

(72) Inventors: Jinwoo Lee, Seoul (KR); Chunyub Park, Busan (KR); Sutae Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1020 days.

(21) Appl. No.: 17/839,724

(22) Filed: Jun. 14, 2022

(65) Prior Publication Data

US 2023/0097159 A1 Mar. 30, 2023

(30) Foreign Application Priority Data

Sep. 24, 2021 (KR) ........................ 10-2021-0126341

(51) Int. Cl.
H10D 64/01 (2025.01)
H10D 84/01 (2026.01)
H10D 84/03 (2025.01)

(52) U.S. Cl.
CPC ... H10D 64/01326 (2026.01); H10D 84/0135 (2025.01); H10D 84/0151 (2025.01); H10D 84/038 (2025.01)

(58) Field of Classification Search
None
See application file for complete search history.

(56) References Cited

U.S. PATENT DOCUMENTS

| | | | |
|---|---|---|---|
| 8,623,770 B1 * | 1/2014 | Gao | .................. H10P 14/69394 |
| | | | 438/785 |
| 9,412,656 B2 | 8/2016 | Fu et al. | |
| 9,466,491 B2 | 10/2016 | Pham et al. | |
| | (Continued) | | |

FOREIGN PATENT DOCUMENTS

| | | |
|---|---|---|
| CN | 105097641 A | 11/2015 |
| KR | 2022-0116959 A | 8/2022 |

OTHER PUBLICATIONS

Office Action in Korean Appln. No. 10-2021-0126341, mailed on Oct. 28, 2025, 23 pages (with English translation).

*Primary Examiner* — Brent A. Fairbanks
*Assistant Examiner* — Derek L Nielsen
(74) *Attorney, Agent, or Firm* — Fish & Richardson P.C.

(57) ABSTRACT

A method of manufacturing a semiconductor device may include forming a hardmask layer on gate lines and intergate insulating portions alternately arranged; respectively forming mandrel lines on regions of the hardmask layer, corresponding to every other one of the intergate insulating portions; conformally forming a spacer material layer, having a thickness corresponding to a width of the gate lines, on the hardmask layer; forming a mandrel material layer on the spacer material layer; removing a portion of the mandrel material layer to expose portions of the spacer material layer on an upper surface and a side surface of the mandrel line; removing the exposed portions of the spacer material layer to provide the mandrel lines and stacked mandrel patterns; and forming an opening in the hardmask layer, which exposes a gate-cut region of the gate lines, using the mandrel lines and the stacked mandrel patterns as a mask.

20 Claims, 21 Drawing Sheets

(56) References Cited

U.S. PATENT DOCUMENTS

| | | | |
|---|---|---|---|
| 9,748,144 B1 | 8/2017 | Lin et al. | |
| 9,818,641 B1 * | 11/2017 | Bouche | H10W 20/089 |
| 10,395,926 B1 * | 8/2019 | Tang | H10P 50/73 |
| 10,672,613 B2 | 6/2020 | Jang et al. | |
| 2016/0218012 A1 | 7/2016 | Shimamoto et al. | |
| 2017/0110364 A1 | 4/2017 | Song et al. | |
| 2018/0033692 A1 * | 2/2018 | Wallace | H10W 20/056 |
| 2018/0366329 A1 * | 12/2018 | Kim | H10D 64/01334 |
| 2019/0318931 A1 * | 10/2019 | Shu | H10P 50/73 |
| 2020/0058559 A1 * | 2/2020 | Yoo | H10D 84/0147 |
| 2020/0111676 A1 * | 4/2020 | Chen | H10P 50/73 |
| 2020/0119163 A1 | 4/2020 | Xie et al. | |
| 2020/0135473 A1 * | 4/2020 | Park | H10D 64/01326 |
| 2020/0135848 A1 * | 4/2020 | Lim | B82Y 10/00 |
| 2020/0227323 A1 | 7/2020 | Zang et al. | |
| 2022/0262790 A1 | 8/2022 | Kim et al. | |

* cited by examiner

I2-I2'

I 2- I 2'

HM
(220)          d3

I2'                                    I2'

CL      240      CL      240      CL
               (260R)

CL
240   260R  250c  240 d3

220
213
212  210  HM
211 w3
(=w1)

130

105

101

I2-I2'

I2-I2'

I1 - I1'

II1 - II1'

I2-I2'

I2-I2'

I2-I2'

I2-I2'

I2- I2'

I2- I2'

I2-I2'

I2-I2'

METHOD OF MANUFACTURING SEMICONDUCTOR DEVICE

CROSS-REFERENCE TO RELATED APPLICATION(S)

This application claims benefit of priority to Korean Patent Application No. 10-2021-012634,1 filed on Sep. 24, 2021 in the Korean Intellectual Property Office, the disclosure of which is incorporated herein by reference in its entirety.

BACKGROUND

The present disclosure relates to a method of manufacturing a semiconductor device.

As demand for high performance, high speed, and/or multifunctionality of semiconductor devices is increasing, demand for high integration density of semiconductor devices is also significantly increasing. According to such downscaling of semiconductor devices, a short channel effect of a transistor may occur, so that reliability of an integrated circuit device may be deteriorated. A semiconductor device including a fin-type active region has been proposed to reduce a short channel effect. In addition, a gate cut technique having high reliability may be required as design rules are reduced.

SUMMARY

Example embodiments provide a method of manufacturing a semiconductor device which may address issues, such as a loss of an interlayer insulating layer, that may occur in a process of cutting a single gate line.

According to an example embodiment, a method of manufacturing a semiconductor device may include providing a semiconductor structure including a plurality of active regions extending on a substrate in a first direction, a plurality of gate lines extending in a second direction that intersects the plurality of active regions, and an interlayer insulating layer around the plurality of gate lines, the interlayer insulating layer having a plurality of intergate insulating portions that respectively extend in the second direction between the plurality of gate lines; forming a hardmask layer on the plurality of gate lines and the interlayer insulating layer; respectively forming mandrel lines on regions of the hardmask layer corresponding to every other one of the plurality of intergate insulating portions, a width of each of the mandrel lines corresponding to a width of the plurality of intergate insulating portions; conformally forming a spacer material layer on the mandrel lines and an upper surface of the hardmask layer, the spacer material layer including first portions on sidewalls of the mandrel lines, second portions on an upper surface of the mandrel lines, and third portions on an upper surface region of the hardmask layer between the first portions of the spacer material layer, and a width of each of the first portions of the spacer material layer corresponding to a width of the plurality of gate lines; forming a mandrel material layer on the spacer material layer; etching back the mandrel material layer to expose the first portions of the spacer material layer and the second portions of the spacer material layer with a remaining portion of the mandrel material layer covering the third portions of the spacer material layer; removing the first portions of the spacer material layer and the second portions of the spacer material layer from the spacer material layer such that stacked mandrel patterns and the mandrel lines are on the hardmask layer afterwards, the stacked mandrel patterns including the remaining portion of the mandrel material layer covering the third portions of the spacer material layer; forming an opening in the hardmask layer using the mandrel lines and the stacked mandrel patterns to provide a mask structure, the opening exposing a gate-cut region of the plurality of gate lines; and removing the gate-cut region using the hardmask layer as a mask pattern to form a gate separation hole.

According to an example embodiment, a method of manufacturing a semiconductor device may include providing a semiconductor structure including a plurality of active regions extending on a substrate in a first direction, a plurality of gate lines extending in a second direction that intersects the plurality of active regions, and a plurality of intergate insulating portions that respectively extend in the second direction between the plurality of gate lines, the plurality of intergate insulating portions including a plurality of first intergate insulating portions and a plurality of a second intergate insulating portions, the plurality of first intergate insulating portions being disposed in a first region of the substrate and each having a first width, the plurality of second intergate insulating portions being disposed in a second region of the substrate and each having a second width, and the second width being greater than the first width; forming a hardmask layer on the plurality of gate lines and the plurality of intergate insulating portions; respectively forming first mandrel lines on first regions of the hardmask layer and forming second mandrel lines on second regions of the hardmask layer, the first regions of the hardmask layer corresponding to every other one of the plurality of first intergate insulating portions and the second regions of the hardmask layer corresponding to every other one of the plurality of second intergate insulating portions, a width of each of the first mandrel lines and a width of each of the second mandrel lines corresponding to a width of the plurality of first intergate insulating portions and a width of the plurality of second intergate insulating portions; conformally forming a spacer material layer on the hardmask layer on which the first mandrel lines and the second mandrel lines are formed, the spacer material layer including first portions on sidewalls of the first mandrel lines and sidewalls of the second mandrel lines, second portions on an upper surface of the first mandrel lines and an upper surface of the second mandrel lines, and third portions in an upper surface region of the hardmask layer between the first portions of the spacer material layer, and a width of each of the first portions of the spacer material layer corresponding to a width of the plurality of gate lines; forming a mandrel material layer on the spacer material layer; etching back the mandrel material layer to expose the first portions of the spacer material layer and the second portions of the spacer material layer; removing the first portions of the spacer material layer and the second portions of the spacer material layer from the spacer material layer such that first stacked mandrel patterns and second stacked mandrel patterns remain on the first regions of the hardmask layer and the second regions of the hardmask layer afterwards, together with the first mandrel lines and the second mandrel lines, the first stacked mandrel patterns and the second stacked mandrel patterns each including a remaining portion of the mandrel material layer covering the third portions of the spacer material layer; forming an opening in the hardmask layer using the first mandrel lines, the second mandrel lines, the first stack mandrel patterns, and the second stacked mandrel patterns to provide a mask structure, the opening exposing gate-cut regions of the plurality of gate lines; and removing the gate-cut regions using the hardmask layer as a mask pattern.

According to an example embodiment, a method of manufacturing a semiconductor device may include providing a semiconductor structure including a plurality of gate lines and a plurality of intergate insulating portions, respectively extending in a first direction and alternately arranged in a second direction, the second direction intersecting the first direction; forming a hardmask layer on the plurality of gate lines and the plurality of intergate insulating portions; respectively forming mandrel lines on regions of the hardmask layer corresponding to every other one of the plurality of intergate insulating portions, a width of each of the mandrel lines corresponding to a width of the plurality of intergate insulating portions; conformally forming a spacer material layer on the hardmask layer and the mandrel lines, a thickness of the spacer material layer corresponding to a width of the plurality of gate lines; forming a mandrel material layer on the spacer material layer; removing a portion of the mandrel material layer to expose portions of spacer material layer that are on an upper surface of the mandrel lines and a side surface of the mandrel lines, such that the removing the portion of the mandrel material layer provides exposed portions of the spacer material layer; removing the exposed portions of the spacer material layer from the spacer material layer such that stacked mandrel patterns and the mandrel lines are on the hardmask layer afterwards, each of the stacked mandrel patterns including a residual spacer material layer portion from the spacer material layer and a portion of the mandrel material layer on the residual spacer material layer portion; forming an opening in the hardmask layer using the mandrel lines and the stacked mandrel patterns to provide a mask structure, the opening exposing a gate-cut region of the plurality of gate lines; and removing the gate-cut region using the hardmask layer as a mask pattern.

BRIEF DESCRIPTION OF DRAWINGS

The above and other aspects, features, and advantages of the present disclosure will be more clearly understood from the following detailed description, taken in conjunction with the accompanying drawings.

FIGS. 4A to 11A are plan views illustrating operations of a method of manufacturing a semiconductor device according to an example embodiment.

FIGS. 4B to 11B are cross-sectional views illustrating operations of a method of manufacturing a semiconductor device according to an example embodiment.

FIGS. 15A to 20A and FIGS. 15B to 20B are cross-sectional views illustrating operations of a method of manufacturing a semiconductor device according to an example embodiment.

DETAILED DESCRIPTION

Hereinafter, example embodiments will be described with reference to the accompanying drawings.

Figure 1:
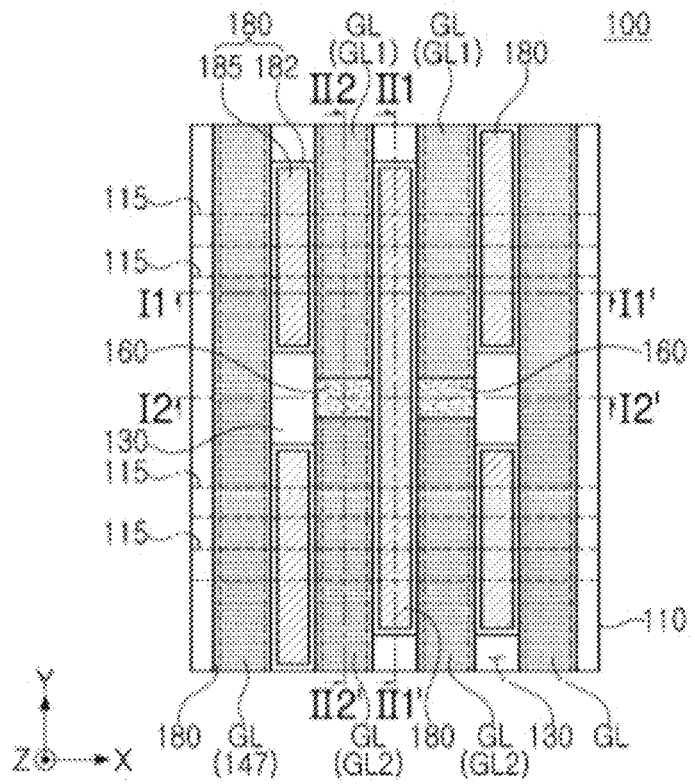
FIG. 1 is a plan view of a semiconductor device according to an example embodiment.
Figure 2A:
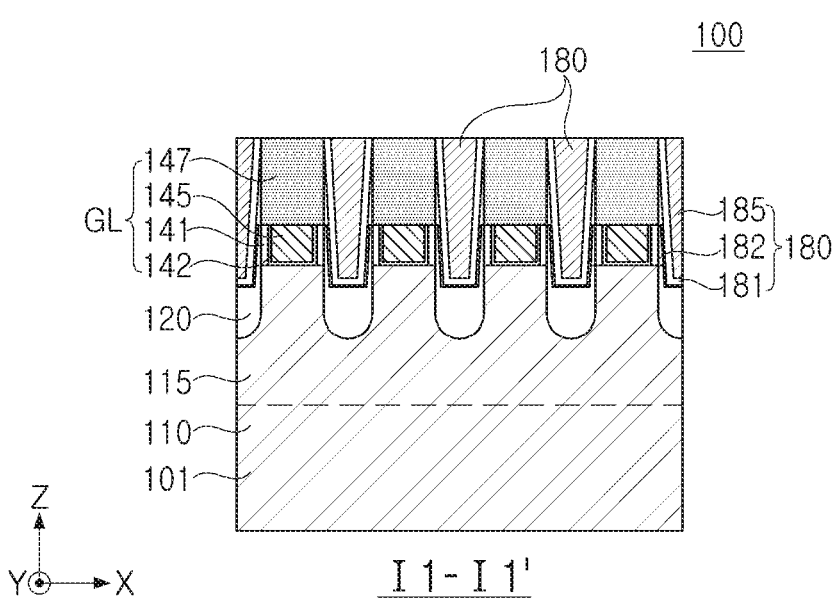
FIGS. 2A and 2B are cross-sectional views of the semiconductor device illustrated in FIG. 1, respectively taken along lines I1-I1' and I2-I2'.
Figure 2B:
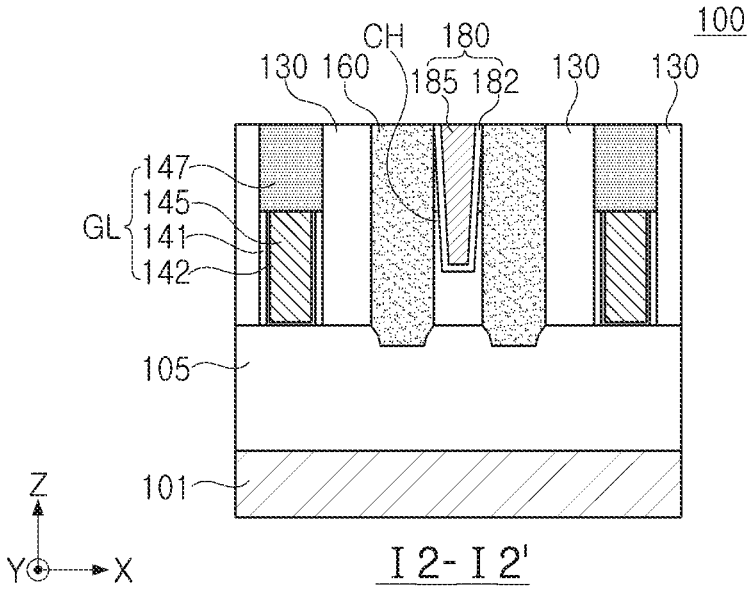
Figure 3A:
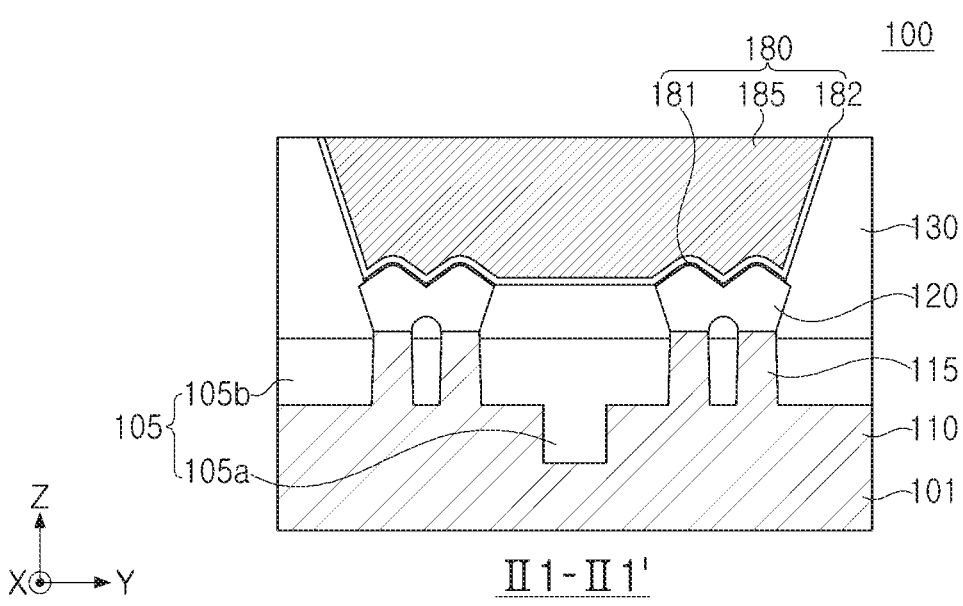
FIGS. 3A and 3B are cross-sectional views of the semiconductor device illustrated in FIG. 1, respectively taken along lines II1-II1' and II2-II2'.
Figure 3B:
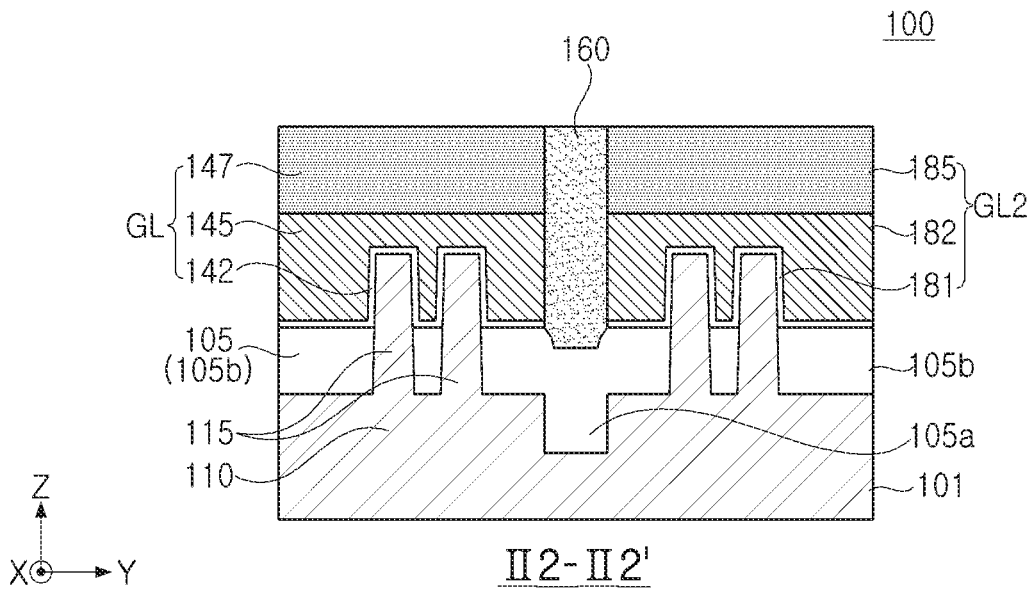

FIG. 1 is a plan view of a semiconductor device according to an example embodiment, FIGS. 2A and 2B are cross-sectional views of the semiconductor device illustrated in FIG. 1, respectively taken along lines I1-I1' and I2-I2', and FIGS. 3A and 3B are cross-sectional views of the semiconductor device illustrated in FIG. 1, respectively taken along lines II1-II1' and II2-II2'.

Referring to FIGS. 1 and 2, a semiconductor device 100 according to the present embodiment may include an active region 110 disposed on a substrate 101, a plurality of active fins 115 extending to the active region 110 in a first direction (for example, an X-direction), and a plurality of gate lines GL intersecting the plurality of active fins 115 on the substrate 101 and extending in a second direction (for example, a Y-direction), perpendicular to the first direction. In the present embodiment, some of the gate lines GL are illustrated as being separated into two gate lines GL1 and GL2 by a gate separation pattern 160.

The substrate 101 may include, for example, a semiconductor such as silicon (Si) or germanium (Ge), or a compound semiconductor such as silicon-germanium (SiGe), silicon carbide (SiC), gallium arsenide (GaAs), indium arsenide (InAs), or indium phosphide (InP). In some embodiments, the substrate 101 may have a silicon-on-insulator (SOI) structure. The active region 110 may be a conductive region such as a well doped with impurities or a structure doped with impurities. For example, the active region 110 may have an n-type well for a PMOS transistor or a p-type well for an NMOS transistor.

Each of the plurality of active fins 115 may have a structure protruding upwardly (for example, in a Z-direction) from an upper surface of the active region 110. As illustrated in FIG. 1, the plurality of active fins 115 may be arranged side by side in the second direction in an active region AR. The plurality of active fins 115 may be provided as a channel region of a transistor. In the present embodiment, two active fins 115 are illustrated as being provided, but the number of the active fins 115 is not limited thereto and a single active fin 115 or another plurality of active fins 115 may be provided.

A device isolation layer 105 may define an active region 110. The device isolation layer 105 may include silicon oxide or a silicon oxide-based insulating material. The device isolation layer 105 includes a first isolation region 105a, defining an active region 110 except for the protruding active fins 115, and a second isolation region 105b defining the active fin 110. The first isolation region 105a may have a bottom surface deeper than the second isolation region 105b. For example, the first isolation region 105a may be referred to as a deep trench isolation (DTI) region, and the second isolation region 105b may also be referred to as shallow trench isolation (STI) region. The second isolation region 105b may be disposed on the active region 110. As described above, the active fin 115 may partially protrude from an upper portion of the second isolation region 105b while penetrating through the second isolation region 105b.

The semiconductor device 100 according to the present embodiment may include a plurality of gate lines GL. As illustrated in FIG. 1, the gate lines GL may extend in the second direction (for example, the Y-direction). The gate lines GL may overlap one region of each of the active fins 115. The gate lines GL may include gate spacers 141, a gate dielectric layer 142 and a gate electrode 145 sequentially disposed between the gate spacers 141, and a gate capping layer 147 disposed on the gate electrode 145.

For example, the gate spacers 141 may include silicon nitride, silicon oxynitride, silicon carbonitride, or silicon oxycarbonitride. The gate dielectric layer 142 may include at least one of a silicon oxide layer, a silicon nitride layer, a silicon oxynitride layer, or a high-k dielectric layer. The high-k dielectric layer may include a material having a higher dielectric constant than silicon oxide such as hafnium oxide (HfO), aluminum oxide (AlO), or tantalum oxide (TaO). The gate electrode 145 may include a conductive material, for example, a metal nitride such as titanium nitride (TiN), tantalum nitride (TaN), or tungsten nitride (WN), and/or a metal such as aluminum (Al), tungsten (W), or molybdenum (Mo), or a semiconductor material such as doped polysilicon. In some embodiments, the gate electrode 145 may have a multilayer structure including two or more layers. In addition, the gate capping layer 147 may include, for example, silicon nitride, silicon oxynitride, silicon carbonitride, or silicon oxycarbonitride.

Referring to FIGS. 2A and 3A, the semiconductor device 100 according to the present embodiment may include a source/drain region 120 and a contact structure 180 connected to the source/drain region 120. The source/drain regions 120 may be formed in some regions of the active fins 115 disposed on opposite sides of the gate lines GL.

In the present embodiment, forming the source/drain region 120 may include forming a recess in a region of the active fin 115 and performing a selective epitaxial growth (SEG) process on the recess. The source/drain region 120 may include Si, SiGe, or Ge, and may have a different material or a different shape according to an N-type or P-type transistor. For example, in the case of a PMOS transistor, the source/drain region 120 may include silicon-germanium (SiGe) and may be doped with P-type impurities (for example, boron (B), indium (In), or gallium (Ga)). A cross-section of the source/drain region 120 (see FIG. 3A, a Y-Z cross-section) may have a pentagonal shape. Meanwhile, in the case of an NMOS transistor, the source/drain region 120 may include silicon and may be doped with N-type impurities (for example, phosphorus (P), nitrogen (N), arsenic (As), or antimony (Sb)). A cross-section of the source/drain region 120 (a Y-Z cross-section) may have a hexagonal shape or a polygonal shape having a gentle angle. As described above, the active fins 115 may constitute a transistor together with the gate lines GL and the source/drain region 120.

In the semiconductor device 100 according to the present embodiment, an interlayer insulating layer 130 may be disposed on the device isolation layer 105. The interlayer insulating layer 130 may be disposed around the gate lines GL. As illustrated in FIG. 1 and FIGS. 2A and 2B, the interlayer insulating layer 130 may be arranged to be alternate with the gate lines GL in the first direction (for example, the X-direction), for example, between the gate lines GLs. The interlayer insulating layer 130 may include an intergate insulating portion disposed between the gate lines GL. In this regard, the interlayer insulating layer 130 may include, for example, Flowable Oxide (FOX), Tonen SilaZene (TOSZ), Undoped Silica Glass (USG), Borosilicate Glass (BSG), PhosphoSilicate Glass (PSG), BoroPhosphoSilicate Glass (BPSG), Plasma Enhanced Tetra Ethyl Ortho Silicate (PETEOS), Fluoride Silicate Glass (FSG), high density plasma (HDP) oxide, Plasma Enhanced Oxide (PEOX), flowable CVD (FCVD) oxide, and combinations thereof. The interlayer insulating layer 130 may be formed using a chemical vapor deposition (CVD) process, a flowable-CVD process, or a spin coating process.

The contact structures 180 employed in the present embodiment may be formed through the interlayer insulating layer 130 and may respectively be connected to the source/drain region 120. As illustrated in FIGS. 2A and 3A, each of the contact structures 180 may include a metal-silicide layer 181, a conductive barrier 182, and a contact plug 185, respectively. The conductive barrier 182 may cover side surfaces and a lower surface of the contact plug 185. The metal silicide layer 181 may be disposed between the conductive barrier 182 and the source/drain regions 120. For example, the conductive barrier 182 may include tantalum (Ta), tantalum nitride (TaN), manganese (Mn), manganese nitride (MnN), tungsten nitride (WN), titanium (Ti), or titanium nitride (TiN). The metal silicide layer 181 may include CoSi, NiSi, or TiSi. The contact plug 185 may include tungsten (W), cobalt (Co), titanium (Ti), alloys thereof, or combinations thereof. In addition, although not illustrated, the semiconductor device 100 according to the present embodiment may include an interconnection structure connected to the contact structure 180 on the interlayer insulating layer 130. The interconnection structure may include dielectric layers, disposed on the interlayer insulating layer 130, and interconnection lines electrically connected to the contact structure 180 in each of the dielectric layers.

Referring to FIGS. 1, 3A, and 3B, a portion of the gate lines GL may be separated into two gate lines GL1 and GL2 by the gate separation pattern 160. The gate separation pattern 160 may be formed by filling a gate separation hole CH, separating the gate line, with an insulating material. For example, the gate separation pattern 160 may include silicon nitride (SiN), silicon oxynitride (SiON), silicon carbonitride (SiCN), or silicon oxycarbonitride SiOCN).

In the semiconductor device 100 according to the present example embodiment, the interlayer insulating layer 130 around the gate separation pattern 160, for example, an upper region of the intergate insulating portion may be hardly lost and may be maintained. Unlike the present embodiment, during formation of the gate separation pattern 160, the interlayer insulating layer 130 around the gate separation hole CH, for example, the upper region of the intergate insulating part may be significantly lost, and an interlayer insulating portion (for example, $SiO_2$) lost during the formation of the gate separation hole CH may be replaced with another material (for example, SiN) filled during the formation of the gate separation pattern 160. In this case, since a hole for the contact structure 180 is not well formed in the portion of the interlayer insulating layer 130 replaced with another material, it may be difficult to form the contact structure 180, or a defect may occur.

However, in the present embodiment, the interlayer insulating layer 130 disposed between the gate separation patterns 160 may be maintained to be relatively stable using a self-aligned patterning process, so that the contact structure 180 passing in the vicinity thereof may be easily formed. For example, referring to FIGS. 1 and 3A, the contact structure 180 may be stably formed in the interlayer insulating layer 130 disposed between the two gate separation patterns 160.

A method of manufacturing a semiconductor device according to an example embodiment may include a gate separation formation process which may significantly reduce loss of an interlayer insulating layer around a gate separation pattern using a self-aligned patterning process.

Hereinafter, a method of manufacturing a semiconductor device according to an example embodiment will be described in detail with reference to FIGS. 4A to 11A and FIGS. 4B to 11B.

Figure 4A:
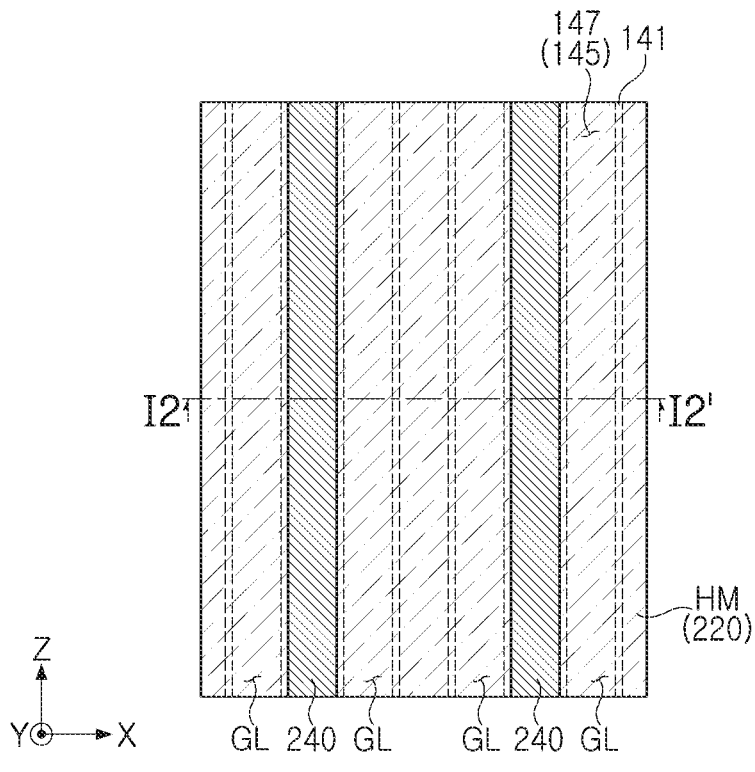
Figure 4B:
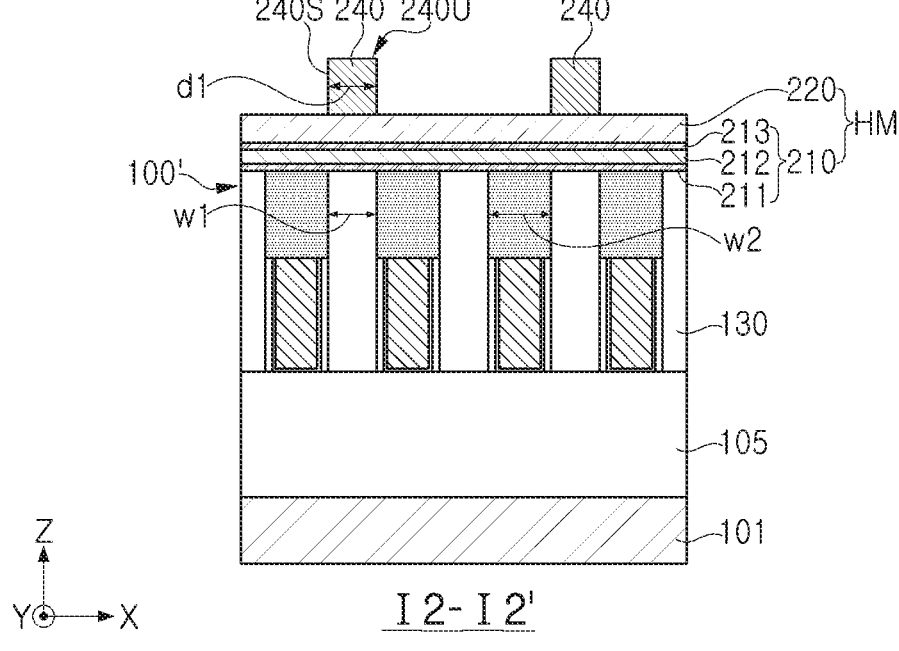

Referring to FIGS. 4A and 4B, a hardmask layer HM may be formed on an upper surface of a semiconductor device, and mandrel lines 240 may be formed on an upper surface of the hardmask layer HM.

A semiconductor device, to which the present process is applied, may include an active region 110 having a plurality of active fins 115 extending in a first direction (for example, an X-direction) on a substrate 101, a plurality of gate lines GL extending in a second direction (for example, a Y-direction) intersecting the plurality of active fins 115, and an interlayer insulating layer 130 disposed around the plurality of gate lines GL. As described above, the gate line GL employed in the present embodiment may include gate spacers 141, a gate dielectric layer 142, a gate electrode 145, and a gate capping layer 147. The interlayer insulating layer 130 may include a plurality of intergate insulating portions disposed between the plurality of gate lines GL. The plurality of intergate insulating portions may have portions extending parallel to the plurality of gate lines GL.

As illustrated in FIG. 4A, a hardmask layer HM may be formed on an upper surface on which a plurality of gate lines GL and a plurality of intergate insulating portions [130] are alternately arranged. The hardmask layer HM employed in the present embodiment may include a first hardmask 210 and a second hardmask 220.

The first hardmask 210 may include a stack having different material layers. Each of the material layers included in the stack may be determined depending on a material of the gate line to be selectively removed during a gate-cut process. The first hardmask 210 may include a first masking layer 211 including a first material, a second masking layer 212 disposed on the first masking layer 211 and including a second material different from the first material, and a third masking layer 213 disposed on the second masking layer 212 and including a third material different from the second material. In some embodiments, the first material may be the same as or similar to the third material, and the second material may include a material having an etching selectivity different from that of the first and third materials. For example, the first and third materials may include silicon oxide or silicon oxycarbide, and the second material may include silicon nitride, silicon oxynitride, silicon carbonitride, or silicon oxycarbonitride.

The second hardmask layer 220 may include a material having etching selectivity with respect to the material forming the third masking layer 213. For example, the second hardmask layer 220 may include a metal compound such as titanium nitride.

As illustrated in 4A and 4B, mandrel lines 240 may be formed in regions, respectively corresponding to every other one of the plurality of intergate insulating portions. Each of the mandrel lines 240 may extend in the second direction (for example, the Y-direction), similarly to the gate lines GL, and may have opposite side surfaces 240S and an upper surface 240U disposed therebetween. Each of the mandrel lines 240 may have a width d1 corresponding to a width w1 of the plurality of intergate insulating portions. The mandrel lines 240, formed in the present process, may be designed to have a desired width using a photolithography process.

The mandrel lines 240 may include a material having etching selectivity with respect to the second hardmask layer 220. For example, the mandrel lines 240 may include amorphous silicon (or polysilicon), and the second hardmask layer 220 may include titanium dioxide (TiO2). A non-mandrel region, in which the mandrel lines 240 are not formed, may correspond to the two intergate insulating portions and a single gate line GL therebetween.

Figures 5A, 5B:
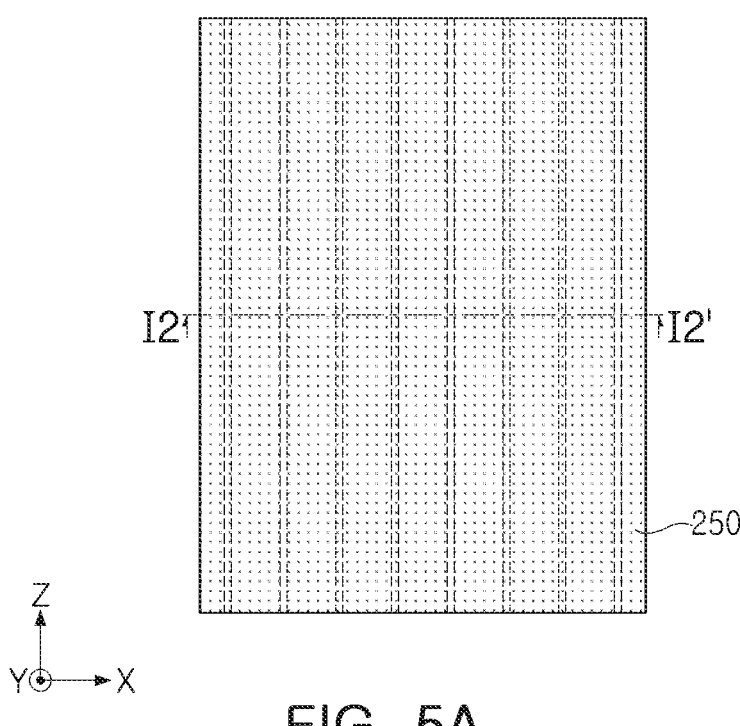

Referring to FIGS. 5A and 5B, a spacer material layer 250 may be conformally formed on the upper surface of the hardmask layer HM on which the mandrel lines 240 are formed.

In the present process, the spacer material layer 250 may be formed to have a constant thickness d2 along the non-mandrel region of the hardmask layer HM and the side surfaces 240S and upper surface 240U of the mandrel line 240. The spacer material layer 250 employed in the present embodiment may have a thickness d2 corresponding to the width w2 of the gate line GL. The spacer material layer 250 may include, for example, silicon oxide, silicon nitride, titanium oxide, titanium nitride, or boron nitride. For example, a process of forming the spacer material layer 250 may be performed by atomic layer deposition (ALD).

The spacer material layer 250 may be divided into three regions 250a, 250b, and 250c depending on a region in which it is formed. As illustrated in FIG. 5B, the spacer material layer 250 may include first portions 250a disposed on sidewalls 240S of the mandrel lines 240, second portions 250b disposed on upper surfaces 240U of the mandrel lines 240, and third portions 250c disposed in an upper surface region of the hardmask layer HM between the first portions 250a.

Each of the first portions 250a, disposed on the sidewalls 240S of the mandrel lines 240, may have a width d2 corresponding to a thickness of the spacer material layer 250, for example, a width d2 of the gate line GL corresponding to a width w2 of the gate line GL. Accordingly, the third portions 250c may have a width d3 corresponding to a width w3 of the intergate insulating portion 130 disposed between the gate lines GL.

Figure 6A:
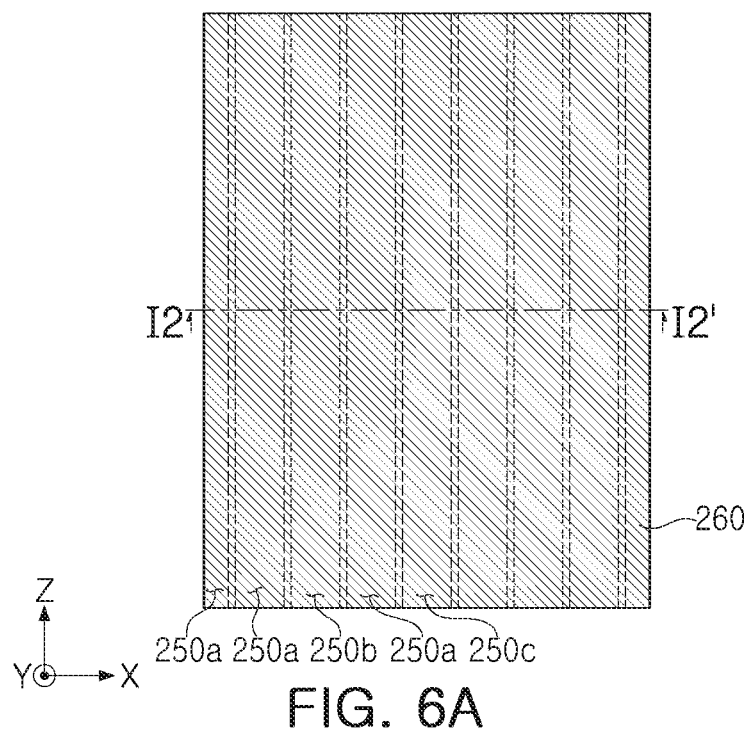
Figure 6B:
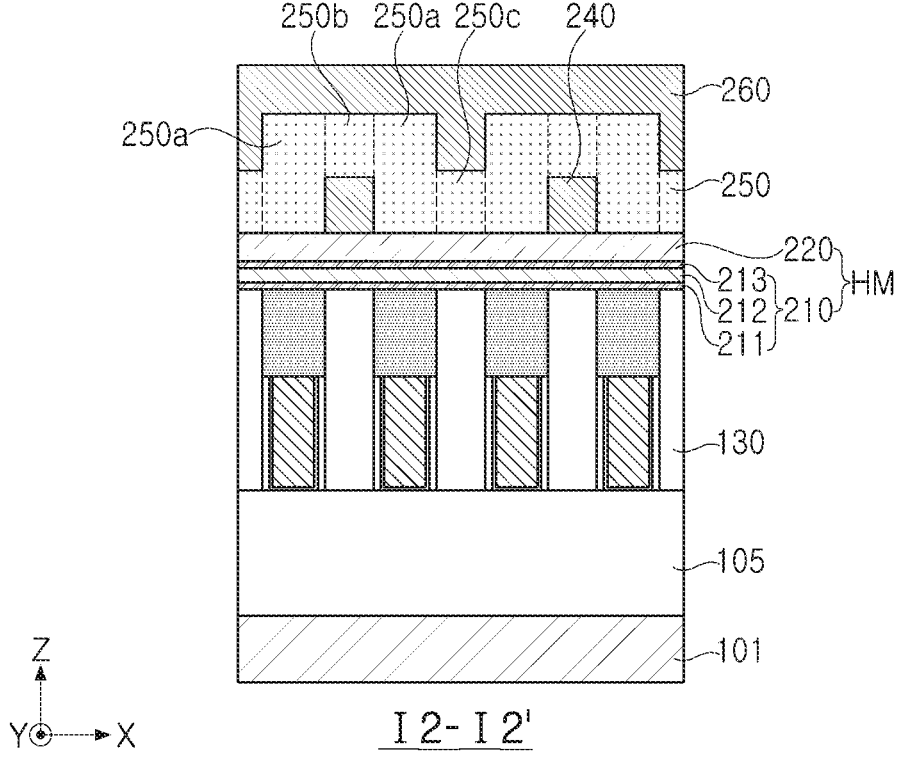

Referring to FIGS. 6A and 6B, a mandrel material layer 260 may be formed to cover the spacer material layer 250.

The method of manufacturing a semiconductor device according to the present embodiment may further include forming a mandrel material layer 260 on the spacer material layer 250. The mandrel material layer 260 may be formed to fill a concave portion of the spacer material layer 250. In an example embodiment, the mandrel material layer 260 may have a substantially planar upper surface. The mandrel material layer 260 may include the same material as the mandrel lines 240. For example, the mandrel material layer 260 may include amorphous silicon (or polysilicon).

Figure 7A:
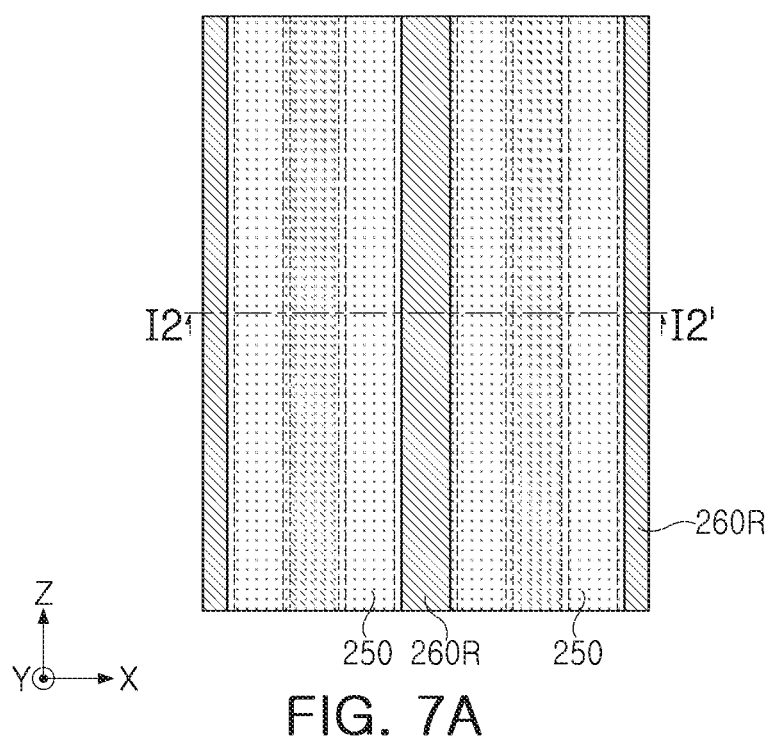
Figure 7B:
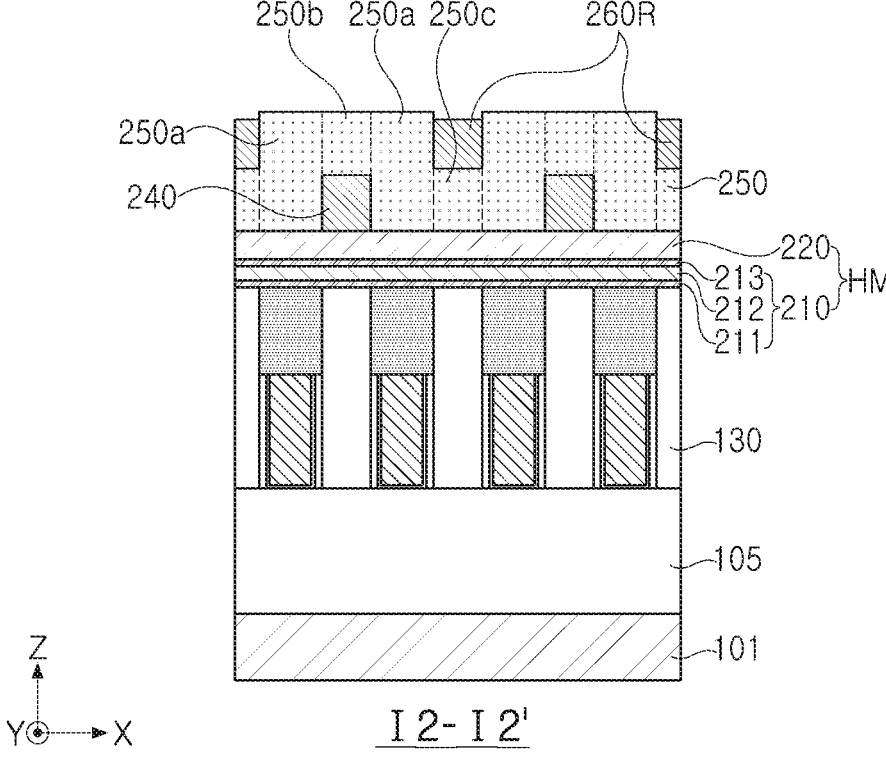

Referring to FIGS. 7A and 7B, the mandrel material layer 260 may be etched back to expose a portion of the spacer material layer 250.

The mandrel material layer 260 may be removed to have a desired and/or alternatively predetermined thickness using an etch-back process. After the etch-back process, the first portions 250a and the second portions 250b of the spacer material layer 250 may be exposed. Meanwhile, a remaining mandrel material layer portion 260R of the mandrel material layer 260 may remain on the third portions 250c of the spacer material layer 250. The etch-back process may be performed using an anisotropic reactive ion etching (RIE) process.

Figures 8A, 8B:
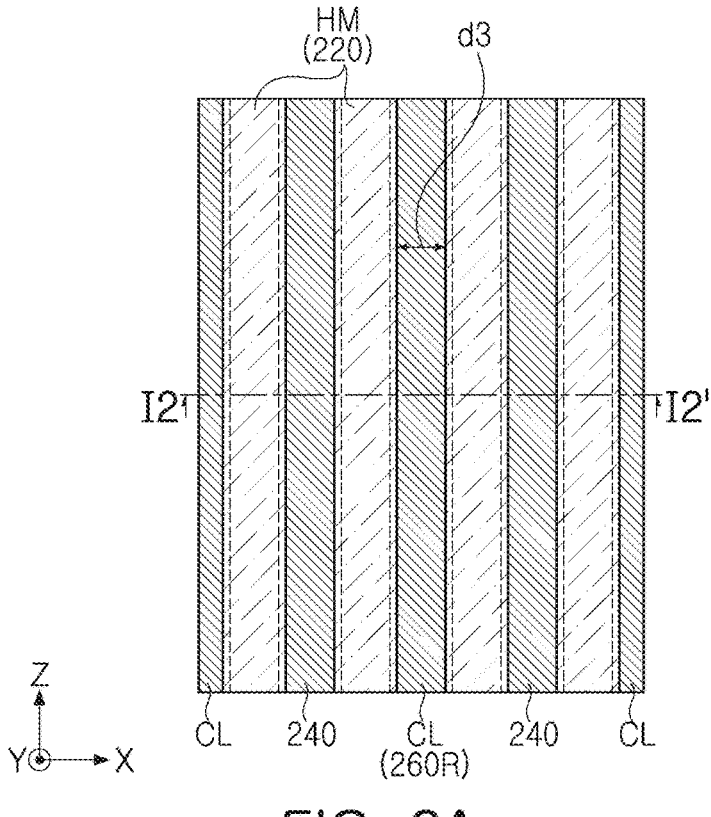

Referring to FIGS. 8A and 8B, the first portions 250a and the second portions 250b may be removed from the spacer material layer 250.

After the present process, the third portions 250c and a mandrel material layer portion 260R on the third portions 250c may remain on the hardmask layer HM together with the mandrel line 240. A stack of the third portions 250c and the remaining mandrel material layer portion 260R will be referred to as "stacked mandrel patterns CL." The stacked mandrel patterns CL may be used as a mask pattern together with the re-exposed mandrel lines 240. The stacked mandrel patterns CL employed in the present embodiment may have a height greater than that of the mandrel lines 240.

The stacked mandrel patterns CL may be disposed on a region corresponding to an intergate insulating portion 130, disposed between the mandrel lines 240, among the plurality of intergate insulating parts 130. Also, the stacked mandrel patterns CL may have a width d3 corresponding to the width w3 of the intergate insulating portion 130. Since the width of the intergate insulating portion 130 is the same (w1=w3), the width w3 of the stacked mandrel patterns CL may be substantially the same as the width d1 of the previously formed mandrel lines 240.

Meanwhile, a gap between the stacked mandrel patterns CL and the mandrel lines 240 may correspond to a width d2 of the first portion 250a of the spacer material layer. For example, a region opened between the stacked mandrel patterns CL and the mandrel lines 240 may have a width w2 corresponding to the gate lines GL.

Then, an opening O2, exposing a cut region CT of the plurality of gate lines GL, may be formed in the hardmask layer HM using the mandrel lines 240 and the stacked mandrel patterns CL (see FIGS. 10A and 10B) as a mask (also referred to as a mask structure). A process of forming such an opening for a cut region may be performed using a photolithography process (see FIGS. 9A and 9B).

Figures 9A, 9B:
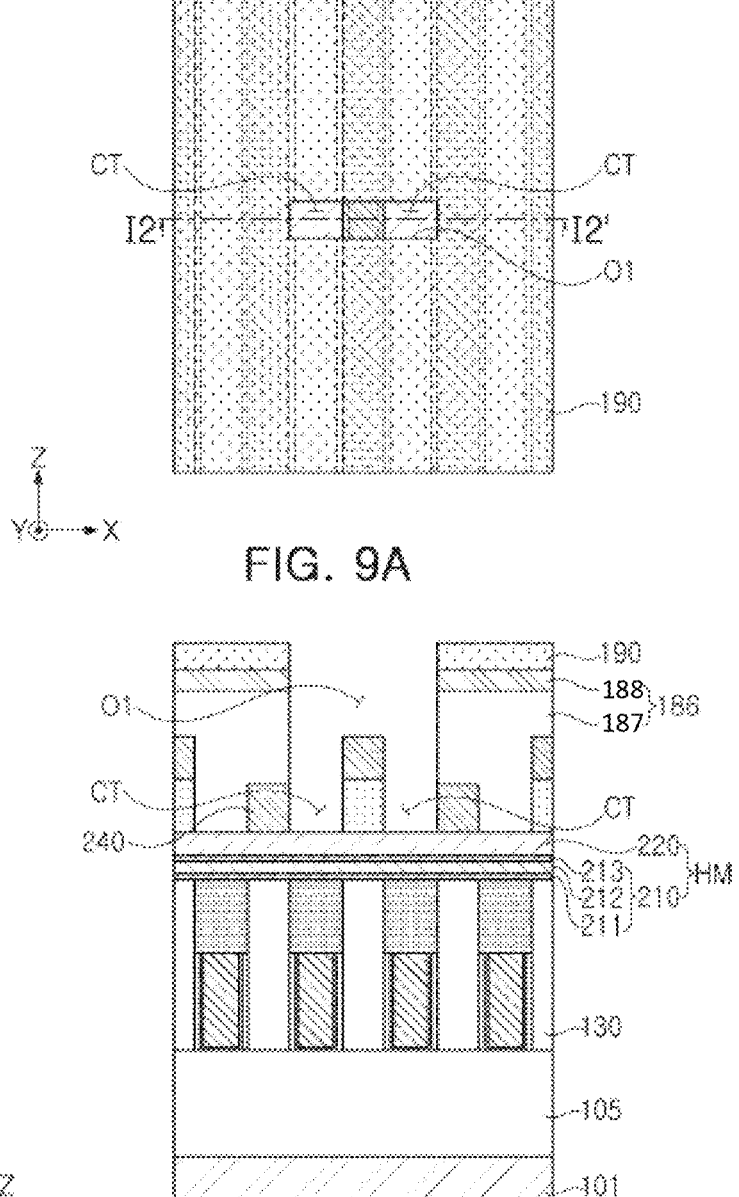

Referring to FIGS. 9A and 9B, a mask stack 186 and a photoresist pattern 190 may be sequentially formed on the hardmask layer on which the mandrel lines 240 and the composite patterns CL are formed.

The mask stack 186 may include a hardmask layer 187 and an antireflective layer 188. For example, the hardmask layer 187 may include a carbon-containing layer such as a spin on hardmask (SOH), silicon oxide, silicon nitride, or silicon oxynitride. In some embodiments, the hardmask layer 187 may include two layers formed of different materials. For example, the antireflective layer 188 may include titanium, titanium dioxide, titanium nitride, chromium oxide, carbon, silicon nitride, silicon oxynitride, or amorphous silicon.

A photoresist pattern 190, having an opening exposing the gate-cut region CT, may be formed on the mask stack 186 using a photolithography process, and a first opening O1 corresponding to the opening may be formed in the mask stack 186 using the photoresist pattern 190. In the present embodiment, the gate-cut region CT may be disposed side by side with two adjacent gate lines GL in the first direction (for example, the X-direction). In this case, the first opening O1 may be provided as a single opening across the stacked mandrel pattern CL. In another embodiment, even when three or more gate-cut regions are disposed side by side in the first direction, the first opening may be provided as a single opening, similarly to the above case.

Figure 10A:
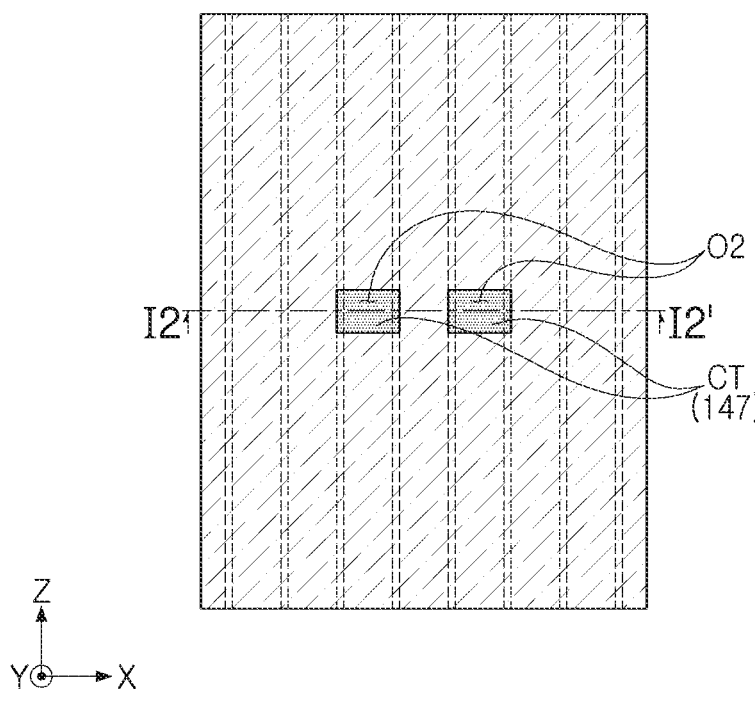
Figure 10B:
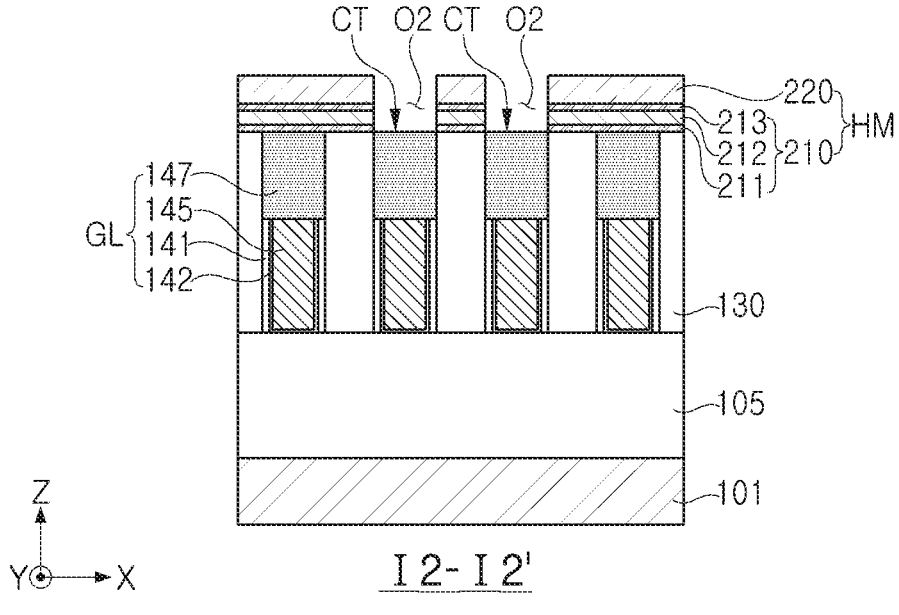

Referring to FIGS. 10A and 10B, a second opening O2 may be formed in the hardmask layer HM using the stacked mandrel pattern CL and the mandrel line 240 together with the mask stack 186.

In the region exposed by the first opening O1 of the mask stack 186, a portion may be blocked by the mandrel lines 240 and the stacked mandrel pattern CL to expose only a desired gate-cut region CT. Accordingly, the hardmask layer HM may be etched through the present process to form the second opening O2, corresponding to the gate-cut region CT, in the hardmask layer HM. After the present process, as illustrated in FIGS. 10A and 10B, the stacked mandrel pattern CL and the mandrel line 240 may be removed from the hardmask layer HM.

Figure 11A:
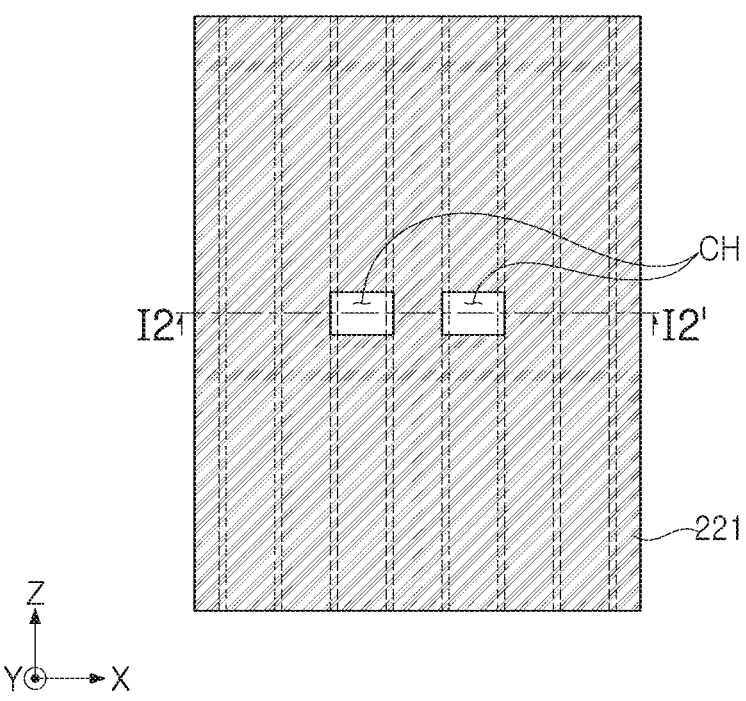
Figure 11B:
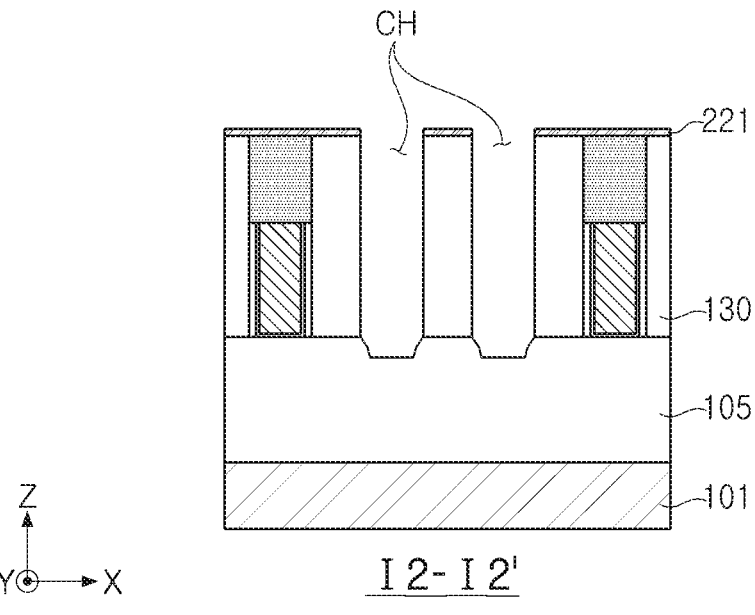

Referring to FIGS. 11A and 11B, the cut region CT may be removed from the gate lines using the hardmask layer HM as a mask (also referred to as a mask pattern) to form a gate separation hole CH.

As described above, each of the mask layers 211, 212, and 213 of the first hardmask 210 may be determined depending on a material of the gate line GL to be selectively removed during the gate-cut process. In the present embodiment, the process of forming the gate separation hole CH may cause the exposed portion of the gate capping layer 147 may be removed using the third masking layer 213 as a mask (also referred to as a masking structure) during the formation of the gate separation hole CH. For example, the third masking layer 213 may be a silicon oxide layer and the gate capping layer 147 may be silicon nitride layer. The process of removing the gate electrode 145 may be performed by oxidizing the gate electrode 145 and removing the oxidized gate electrode 145 using the second masking layer 212 as a mask (also referred to as masking pattern). In the process of removing the oxidized gate electrode 145, the third masking layer 213 may also be removed, and the second masking layer 212 may be exposed to be used as a mask. For example, the second masking layer 212 may be silicon nitride. In addition, the gate dielectric layer 142 and/or the gate spacer 141 may be removed together with the gate electrode 145 and gate capping layer 147 to form a desired gate separation hole. The second masking layer 212 may be removed from the first masking layer 211.

After the gate separation hole CH is formed, an insulating material may fill the gate separation hole CH to form a gate separation pattern 160. The insulating material, filling the gate separation hole CH to form the gate separation pattern 160, may include an insulating material different from that of the interlayer insulating layer 130. For example, the gate separation pattern 160 may include silicon nitride (SiN), silicon oxynitride (SiON), silicon carbonitride (SiCN), or silicon oxycarbonitride (SiOCN), and the interlayer insulating layer 130 may include a low-k dielectric material such as silicon oxide.

A process according to the present disclosure may be beneficially used as a method of manufacturing a semiconductor device having a plurality of regions in which pitches of gate lines are different from each other. In this case, the semiconductor device includes interlayer insulating layers (or intergate insulating portions) having different widths, so that a mask pattern of each region needs to be formed to have a width to block an interlayer insulating layer having another width. In the process according to the present embodiment, mask patterns having different widths may be formed in each region even by a single self-aligning process, so that loss of the interlayer insulating layer around the gate separation region may be significantly reduced in the gate separation pattern formation process, and defects may be limited and/or prevented from occurring during the formation of the contact structure.

Figure 12A:
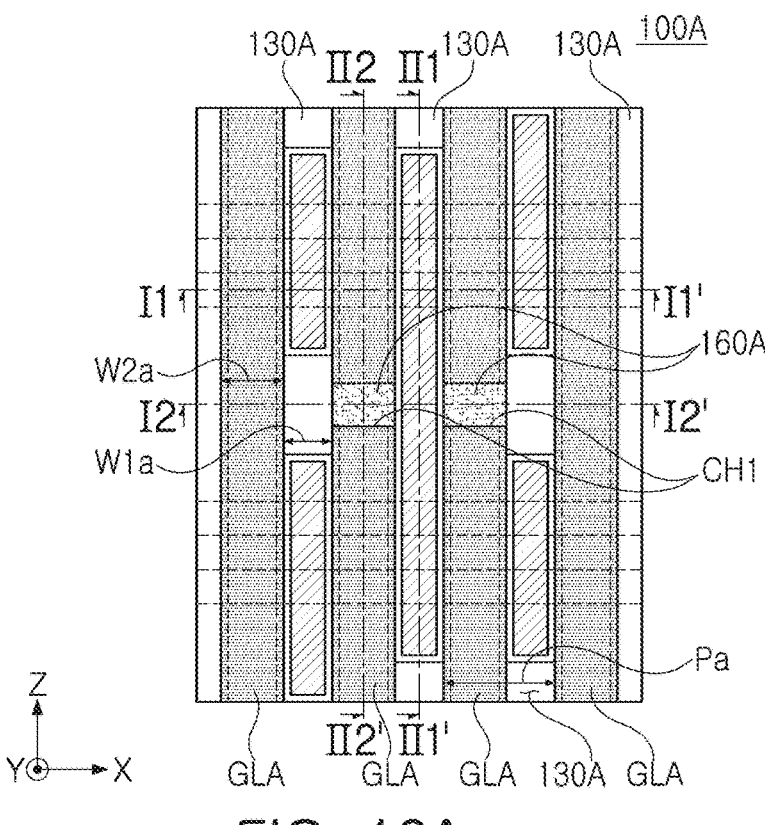
FIGS. 12A and 12B are plan views illustrating a first region and a second region of a semiconductor device according to an example embodiment.
Figure 12B:
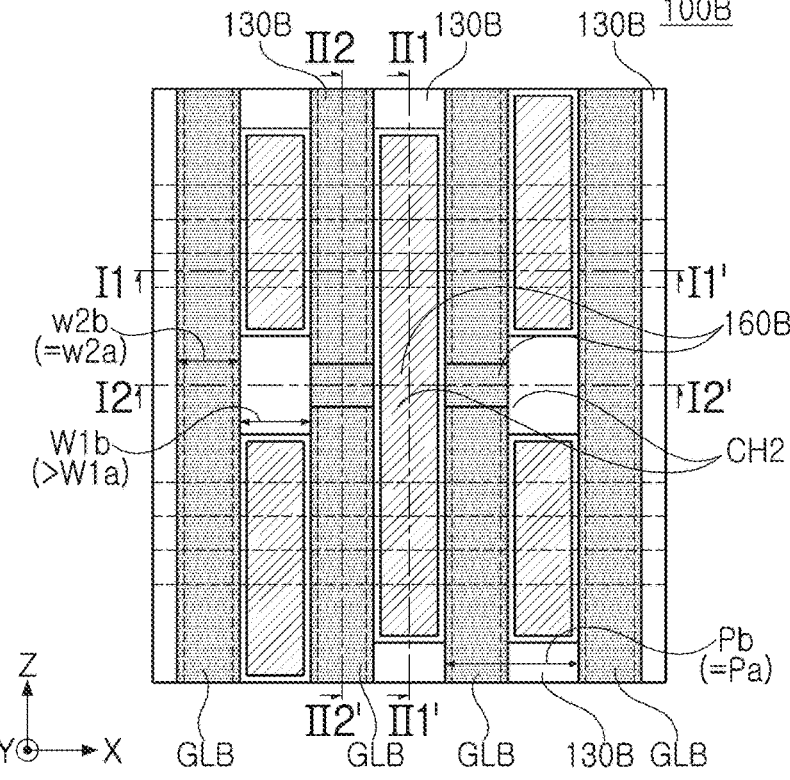
Figure 13A:
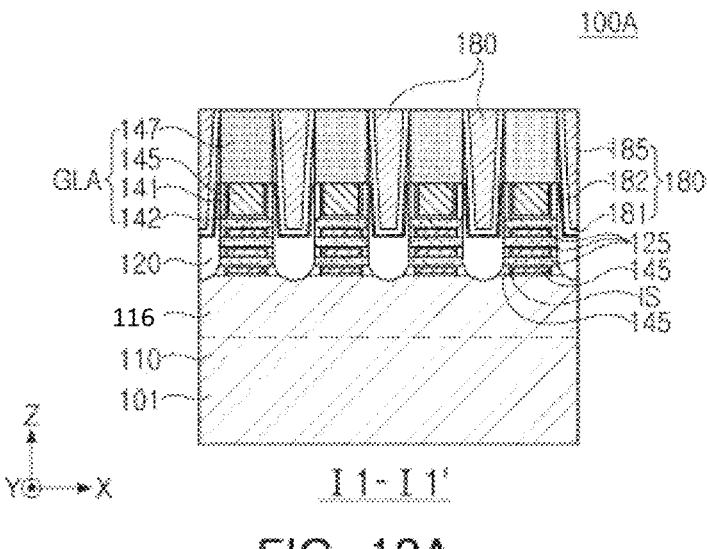
FIGS. 13A to 13C are cross-sectional view of the semiconductor device illustrated in FIG. 12A, respectively taken along lines I1-I1', II1-II1', and II2-II2'.
Figure 13B:
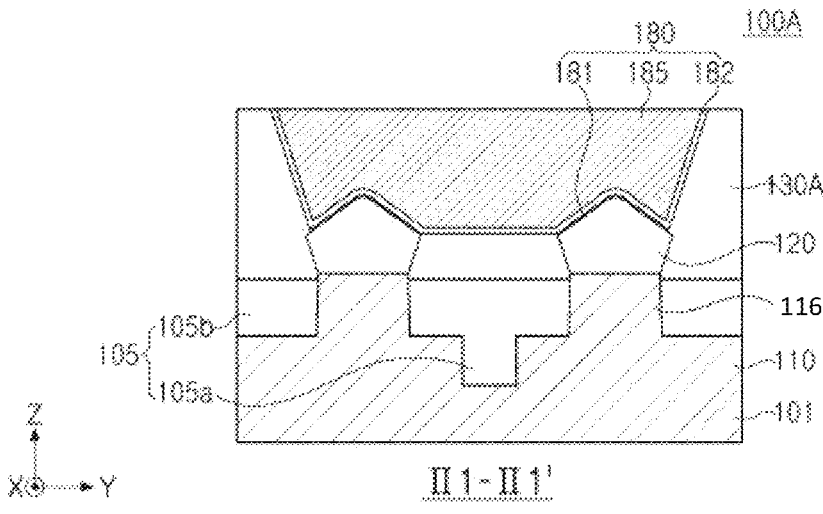
Figure 13C:
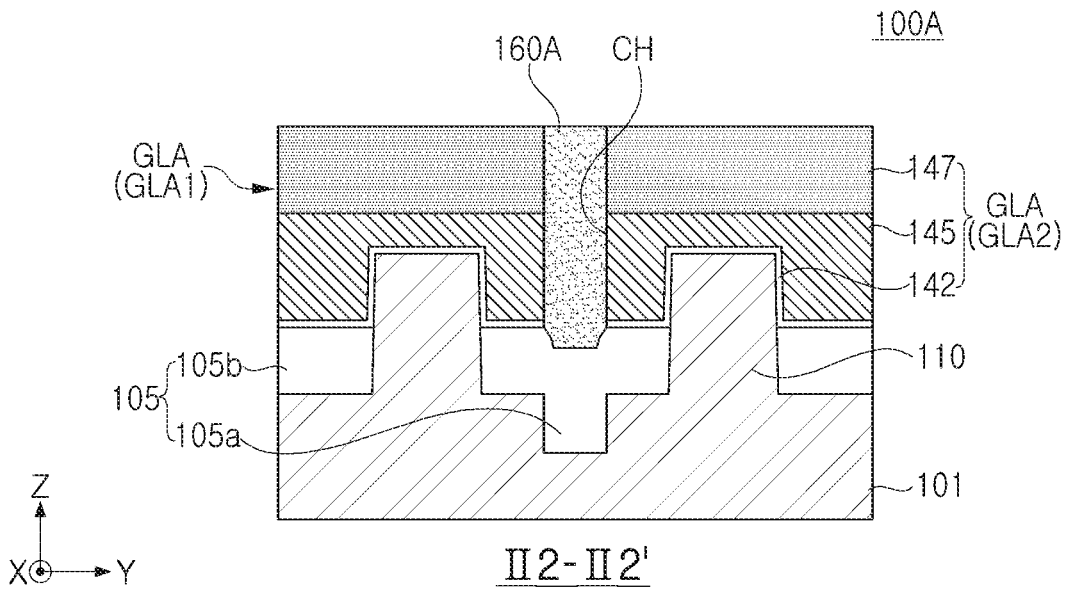
Figure 14A:
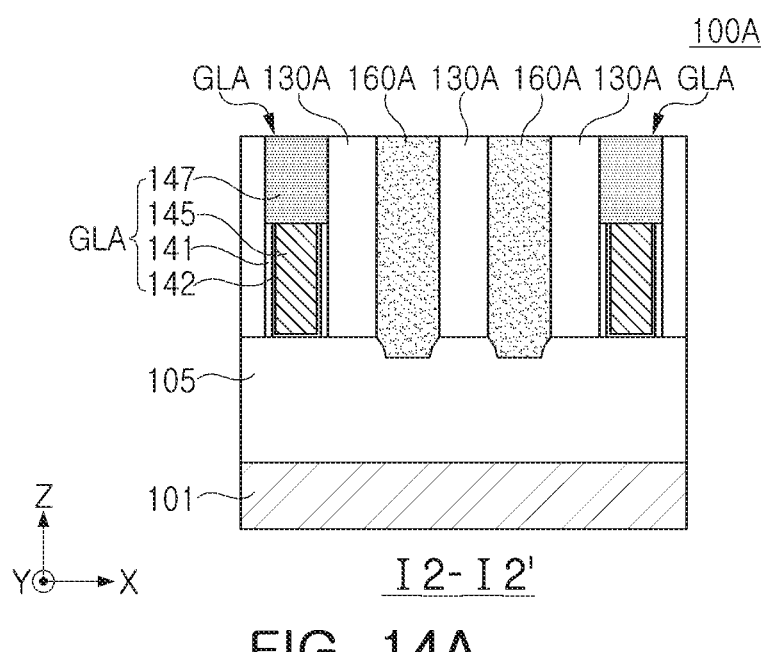
FIGS. 14A and 14B are cross-sectional views of the first and second regions illustrated in FIGS. 12A and 12B, taken along line I2-I2'.
Figure 14B:
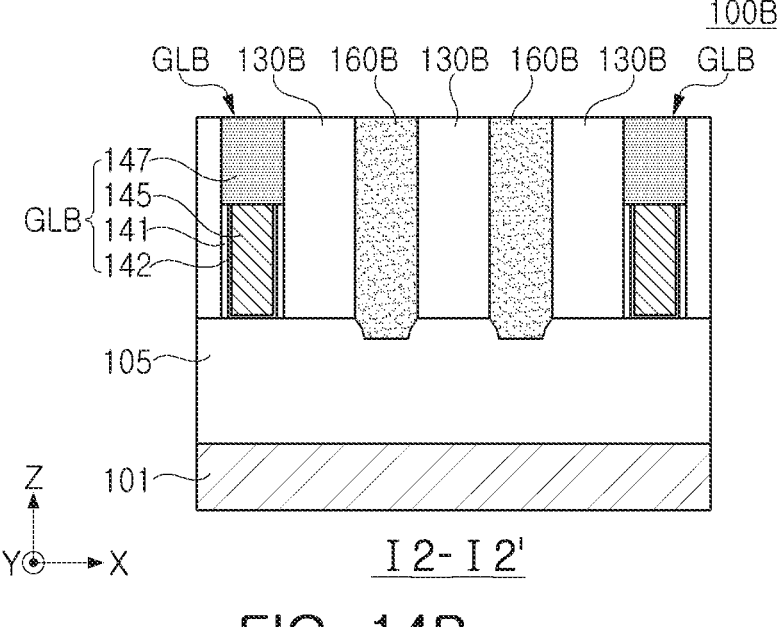

FIGS. 12A and 12B are plan views illustrating a first region and a second region of a semiconductor device according to an example embodiment, FIGS. 13A to 13C are cross-sectional view of the semiconductor device illustrated in FIG. 12A, respectively taken along lines I1-I1', III-III1', and II2-II2', and FIGS. 14A and 14B are cross-sectional views of the first and second regions illustrated in FIGS. 12A and 12B, taken along line I2-I2'.

Referring to FIGS. 12A to 14B, a semiconductor device according to the present embodiment may be understood to be similar to the example embodiment illustrated in FIGS. 1 to 3B, except that it is implemented as a multi-channel structure and pitches Pa and Pb of gate lines in a first region 100A and a second region 100B are different from each other. In addition, components of the present embodiment may be understood with reference to the descriptions of the same or similar components of the example embodiment illustrated in FIGS. 1 to 3B, unless otherwise specified.

As illustrated in FIGS. 13A to 13C, the semiconductor device may include an active pattern 116 extending upwardly of each active region 110 in a first direction (for example, an X-direction). In addition, the semiconductor device may include a plurality of channel layers 125, disposed to be spaced apart from each other on an active pattern 116 in a direction (for example, a Z-direction), perpendicular to an upper surface of a substrate 101, and each having a nanosheet structure, and a gate electrode 145 surrounding the plurality of channel layers 125 and extending in a second direction (for example, a Y-direction) intersecting the first direction (for example, the X-direction). As described above, the gate electrode 145 employed in the present embodiment may also be formed to be interposed between the gate spacers 141 and the plurality of channel layers 125.

The semiconductor device according to the present embodiment may include a source/drain region 120 disposed in the active region 110, formed on opposite sides adjacent to the gate electrode 145, to connected to the plurality of channel layers 125. In the present embodiment, the source/drain regions 120 may be disposed on the active patterns 116 disposed on opposite sides adjacent to the gate electrode 145 and may be connected to opposite sides of the plurality of channel layers 125 in the first direction (for example, the X-direction), respectively. In the present embodiment, three channel layers 125 are illustrated, but the number of the channel layers 125 is not limited thereto. The channel layers 125 may include semiconductor patterns. For example, the semiconductor patterns may include at least one of silicon (Si), silicon germanium (SiGe), and germanium (Ge). The source/drain region 120 may include an epitaxial layer formed using the plurality of channel layers 125 and a recessed surface of the active pattern 116 as seeds. The source/drain region 120 may include at least one of silicon germanium (SiGe), silicon (Si), and silicon carbide (SIC).

The semiconductor device according to the present embodiment may include internal spacers IS provided between each of the source/drain regions 120 and the gate electrode 145. The internal spacers IS may be provided on one side of the gate electrode 145. The internal spacers IS and the channel layers 125 may be alternately disposed in the third direction (for example, the Z-direction), perpendicular to an upper surface of the substrate 101. Each of the source/drain regions 120 may be in contact with the channel layer 125, and may be spaced apart from the gate electrode 145 with the internal spacers IS interposed therebetween. The gate dielectric layer 142 may be interposed between the gate electrode 145 and each of the channel layers 125, and may extend between the gate electrode 145 and each of the internal spacers IS.

As described above, the semiconductor device according to the present embodiment may include a gate-all-around field effect transistor. For example, similarly to the first region 100A illustrated in FIGS. 13A to 13C, the second region 100B may include a gate-all-around field effect transistor.

Referring to FIG. 12A, the first region 100A of the semiconductor device may include a plurality of first gate lines GLA and a plurality of first intergate insulating portions 130A alternately arranged in a first direction (for example, an X-direction). Similarly, referring to FIG. 12B, the second region 100B of the semiconductor device may include a plurality of second gate lines GLB and a plurality of second intergate insulating portions 130B alternately arranged in a first direction (for example, an X-direction).

In the first region 100A, a plurality of first gate lines GLA may be arranged at a first pitch Pa, whereas in the second region 100B of the same semiconductor device, a plurality of second gate lines GLB may be arranged at a second pitch Pb greater than the first pitch Pa. For example, a width W2$a$ of the first gate line GLA may be substantially the same as a width W2$b$ of the second gate line GLB, but a width W1$b$ of the second intergate insulating portion 130B may be greater than a width W1$a$ of the first intergate insulating portion 130A. Some of the first and second gate lines GLA and GLB may be separated into two gate lines GLA1 and GLA2 and GLB1 and GLB2 by first and second gate separation patterns 160A and 160B, respectively.

According to the present embodiment, the first and second gate separation patterns 160A and 160B may be formed by a single gate-cut process. The self-aligned patterning process, proposed by the present inventors, may be applied to the gate-cut process to form the first and second intergate insulating portions 130A and 130B, having different widths W1$a$ and W1$b$ to appropriately block the first and second intergate insulating portions 130A and 130B having the different widths W1$a$ and W1$b$, as a mask pattern.

As described above, mask patterns (for example, first and second stacked mandrel patterns), having different widths for forming gate separation patterns in a region in which pitches of gate lines are different from each other, may be formed through a single self-aligning patterning process. In addition, loss of the interlayer insulating layer, caused by mismatch (for example, width mismatch) between the mask pattern and the intergate insulating portions 130A and 130B, blocking targets, may be effectively suppressed.

Accordingly, in the final structure (see FIGS. 14A and 14B), not only the first intergate insulating portion 130A disposed between two first gate separation patterns 160A but also the second intergate insulating portion 130B disposed between two second gate separation patterns 160B may have a stable structure without loss caused by etching. For example, a loss variation (for example, less than 20% based on a lost height), caused by etching in the first region 100A and the second region 100B, may be significantly reduced.

As described above, in the method of manufacturing a semiconductor device according to an example embodiment, loss of an interlayer insulating layer (or the first and second integrate insulating portions 130A and 130B) around the first and second gate separation patterns 160A and 160B may be significantly reduced using a self-aligned patterning process.

FIGS. 15A to 20A and FIGS. 15B to 20B are cross-sectional views illustrating operations of a method of manufacturing a semiconductor device according to an example embodiment.

A method of manufacturing a semiconductor device according to the present embodiment may be understood as a method of manufacturing the semiconductor device illustrated in FIGS. 12A to 14B, and may be understood to be similar to the example embodiment illustrated in FIGS. 4A to 11B, except that pitches Pa and Pb of gate lines in a first region 100A and a second region 100B are different from each other. In addition, components of the present embodiment may be understood with reference to the descriptions of the same or similar components of the example embodiment illustrated in FIGS. 4A to 11B, unless otherwise specified.

Figure 15A:
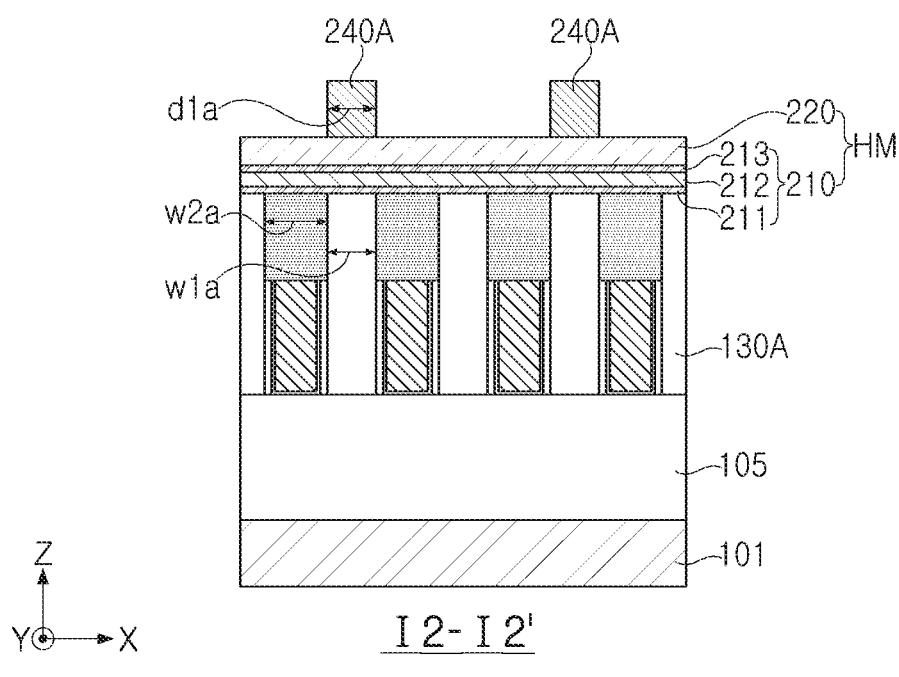
Figure 15B:
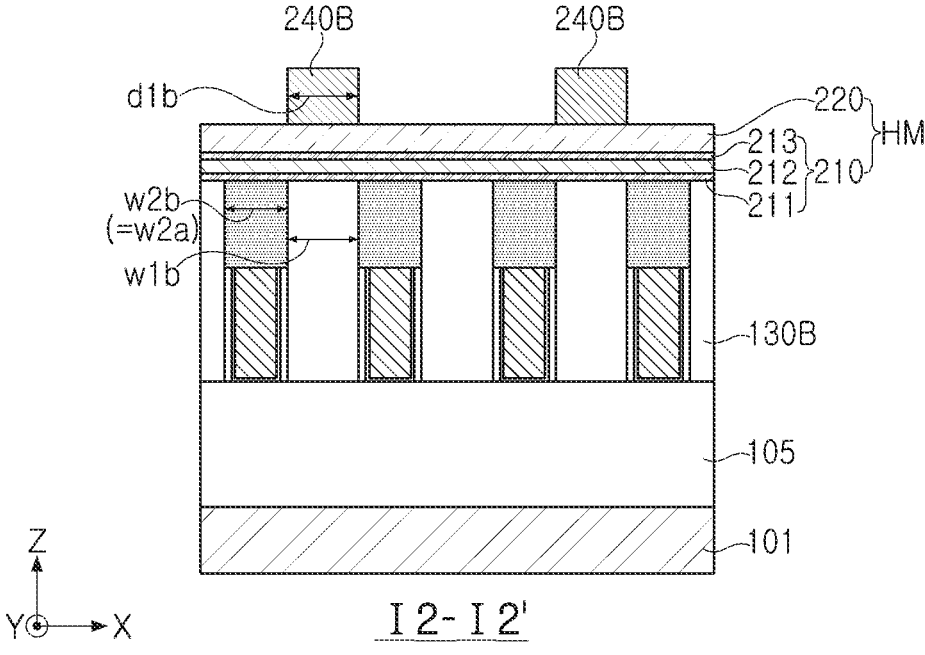

Referring to FIGS. 15A and 15B, a hardmask layer HM may be formed on the first and second regions 100A and 100B of the semiconductor device, and first and second mandrel lines 240A and 240B may be formed on an upper surface of the hardmask layer HM to correspond to the first and second regions 100A and 100B.

Hardmask layers HM having the same structure may be formed in the first region 100A and the second region 100B through the same process. As described above, the plurality of first gate lines GLA disposed in the first region 100A may be arranged at a first pitch, and the plurality of second gate lines GLB disposed in the second region 100B may be arranged at a second pitch greater than the pitch. For example, the width W2a of the first gate line GLA may be substantially the same as the width W2b of the second gate line GLB, and the first and second intergate insulating portions 130A and 130B may have different widths W1a and W1b.

Similar to the previous embodiment (see FIGS. 4A and 4B), the first and second mandrel lines 240A and 240B may be disposed on regions of the hardmask layer HM, in which each of the first and second mandrel lines 240A and 240B corresponds to every other one of the plurality of first and second intergate insulating portions 130A and 130B.

Each of the first mandrel lines 240A may have a width d1a corresponding to the width w1a of the plurality of first intergate insulating portions 130A, and each of the second mandrel lines 240B may have a width d1b corresponding to the width w1b of the plurality of second intergate insulating portions 130B. As described above, since the first and second mandrel lines 240A and 240B are formed using a photolithography process, they may be formed to have different widths in desired regions.

Figure 16A:
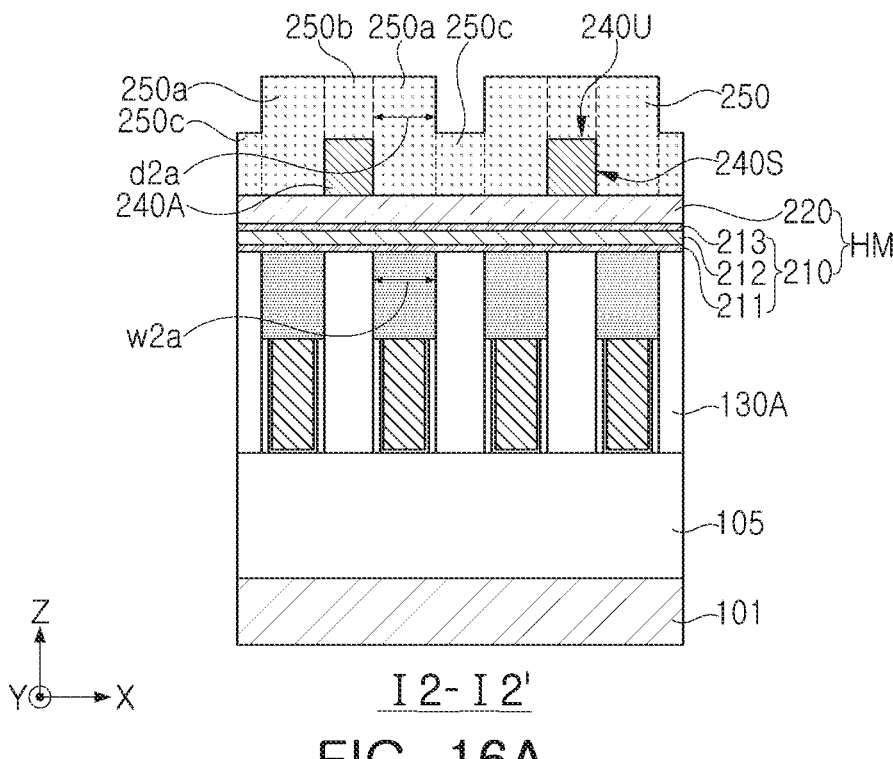
Figure 16B:
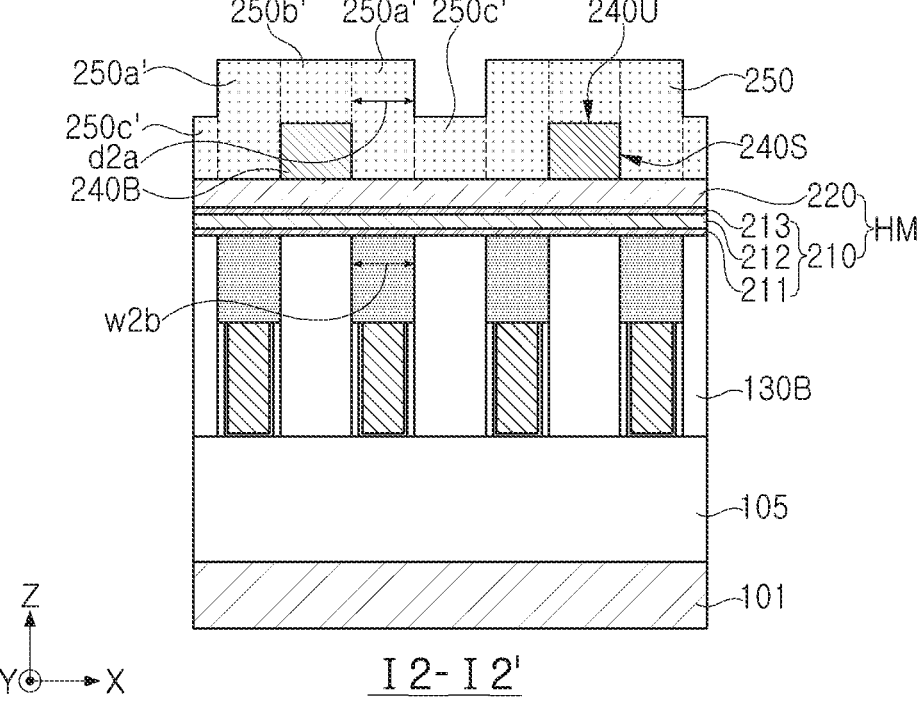

Referring to FIGS. 16A and 16B, a spacer material layer 250 may be conformally formed on the hardmask layer HM on which the first and second mandrel lines 240A and 240B are formed.

The spacer material layer 250 may be formed to have a constant thickness along a non-mandrel region of the hardmask layer HM and side surfaces 240S and an upper surface 240U of the first and second mandrel lines 240A and 240B (d2a=d2b).

In the present embodiment, the first and second gate lines GLA and GLB have the same width (w1a=w1b), so that regions corresponding to the first and second gate lines GLA and GLB may be covered with the spacer material layers having the same thickness. For example, each of the first portions 250a disposed on the sidewalls 240S of the first mandrel lines 240A may have a width d2a corresponding to a thickness of the spacer material layer 250, for example, a width d2a corresponding to the width w2a of the first gate line GLA. Similarly, each of the first portions 250a disposed on the sidewalls 240S of the second mandrel lines 240B may have a width d2b corresponding to the thickness of the spacer material layer 250, for example, a width (d2b=d2a) corresponding to a width of the second gate line GLB (w2b=w2a).

Figure 17A:
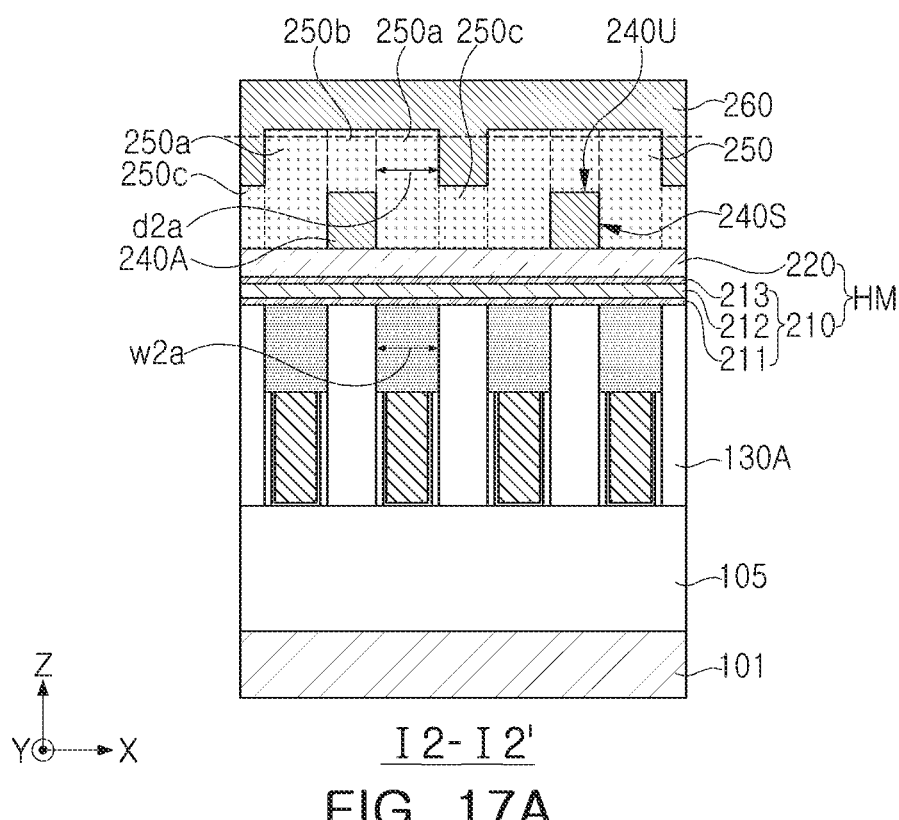
Figure 17B:
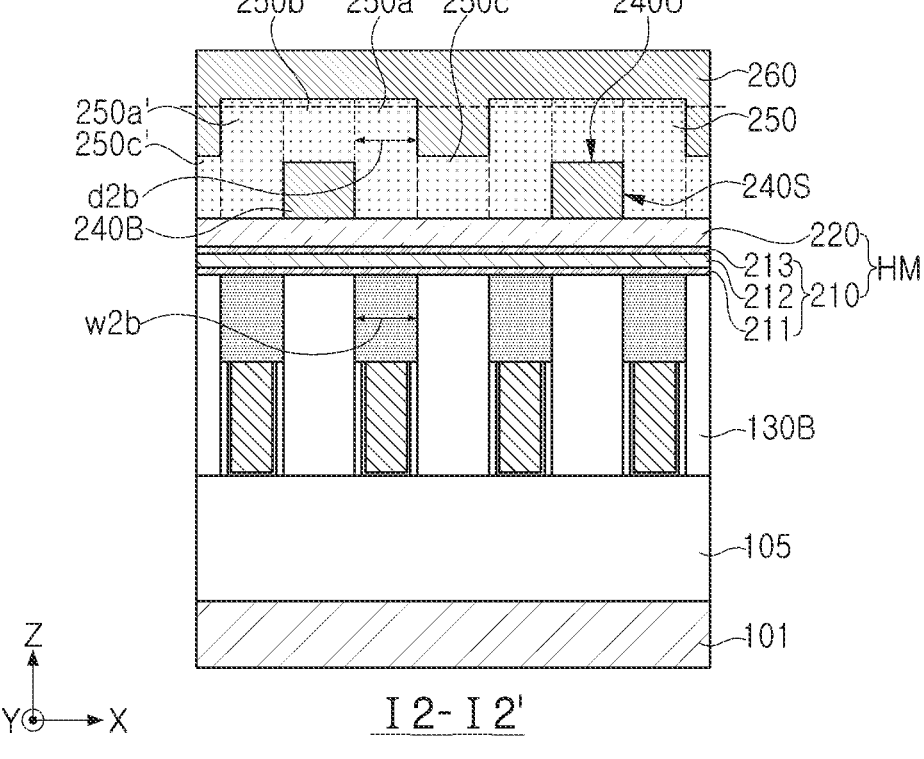

Referring to FIGS. 17A and 17B, a mandrel material layer 260 may be formed to cover the spacer material layer 250, and the mandrel material layer 260 may be then etched back almost to a portion, represented by a dashed line, to expose a portion of the spacer material layer 250.

The mandrel material layer 260 may be formed to fill a concave portion of the spacer material layer 250. In an example embodiment, the mandrel material layer 260 may have a substantially planar upper surface. The mandrel material layer 260 may include the same material as the first and second mandrel lines 240A and 240B.

Next, the mandrel material layer 260 may be removed to have a desired and/or alternatively predetermined thickness (see the dashed line) using an etch-back process. After the etch-back process, first portions 250a and second portions 250b of the spacer material layer 250 may be exposed. Meanwhile, the mandrel material layer 260 may remain on third portions 250c and 250c' of the spacer material layer 250. The third portions 250c, disposed in the first region 100A, may have a width (d3a=d1a) corresponding to the width of the first intergate insulating portion 130A (w3a=w1a), and the third portions 250c' disposed in the second region 100B may have a width (d3b=d1b>d3a) corresponding to a width of the second intergate insulating portion 130B (w3b=w1b>w3a).

Figure 18A:
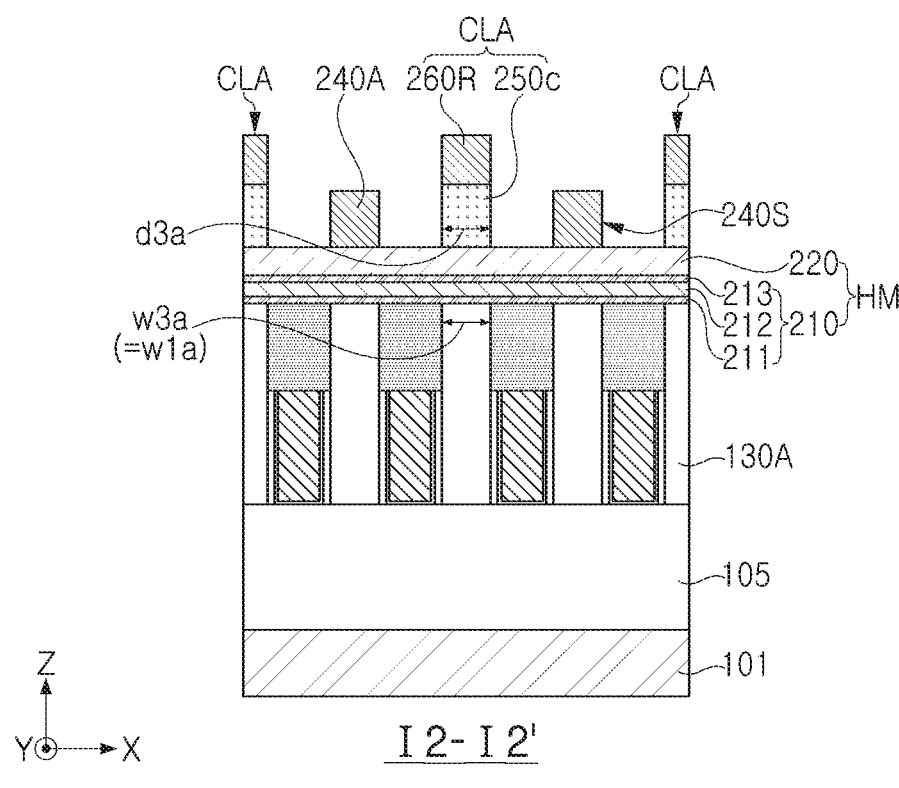
Figure 18B:
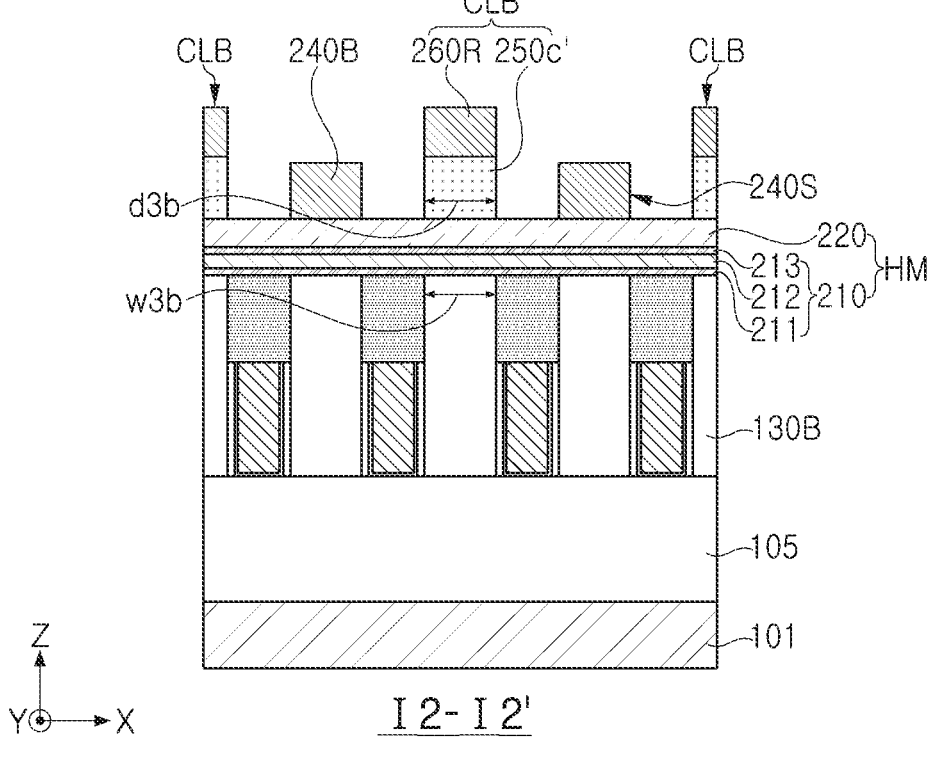

Next, the first portions 250a and the second portions 250b may be removed from the spacer material layer 250, allowing a stack pattern of the third portions 250c and 250c' and a residual mandrel material layer portion 260R to respectively remain on the hardmask layers HM in the first and second regions, as illustrated in FIGS. 18A and 18B. Stack patterns 250c and 260R in the first region may be referred to as first stacked mandrel patterns CLA, and stack patterns 250c' and 260R in the second region may be referred to as second stacked mandrel patterns CLB.

The first stacked mandrel patterns CLA may be disposed on a region corresponding to the first intergate insulating portion 130A, disposed between the mandrel lines 240A, among the plurality of first intergate insulating portions 130A, and may have a width d3a corresponding to a width of the first intergate insulating portion 130A (w3a=w1a). As described above, the width d3a of the first stacked mandrel patterns CLA may substantially correspond to the width d1a of the first mandrel line 240A, and each of the first stacked mandrel patterns CLA may be disposed to cover a region corresponding to the first intergate insulating portion 130A.

Similarly, the second stacked mandrel patterns CLB may be disposed on a region, corresponding to the second intergate insulating portion 130B disposed between the second mandrel lines 240B, among the plurality of second intergate insulating portions 130B, and may have a width d3b corresponding to a width of the second intergate insulating portion (w3b=w1b). As described above, the width d3b of the second stacked mandrel patterns CLB may substantially correspond to the width d1b of the second mandrel line 240B, and each of the second stacked mandrel patterns CLB may be disposed to cover a region corresponding to the second intergate insulating portion 130B.

As described above, even when the first intergate insulating portion 130A of the first region 100A and the second intergate insulating portion 130B of the second region 100B have different widths, mask patterns having different widths (for example, a mandrel line and a stacked mandrel pattern), which may block the first and second intergate insulating portions 130A and 130B, may be simultaneously formed using a single self-aligned patterning process.

Figure 19A:
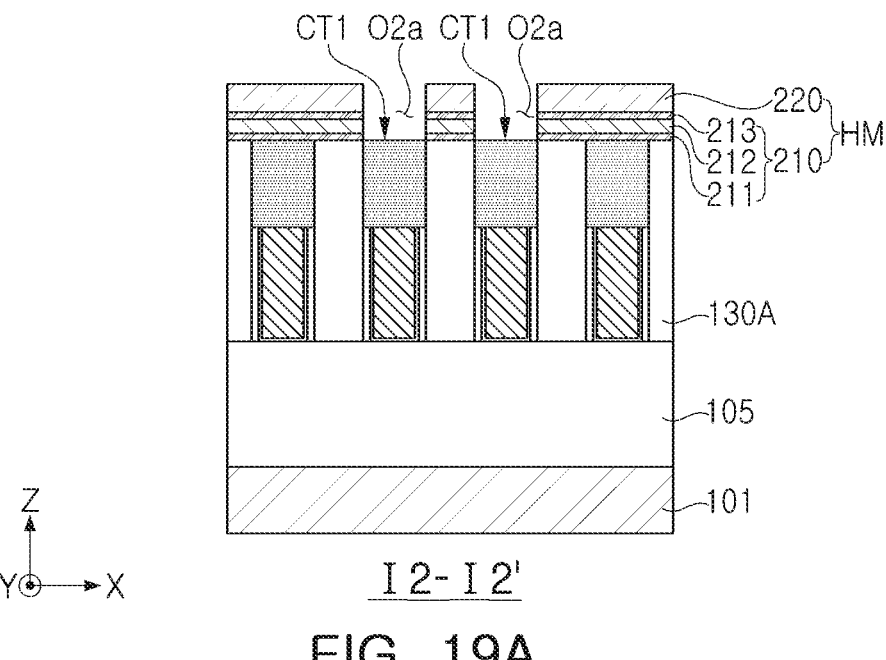
Figure 19B:
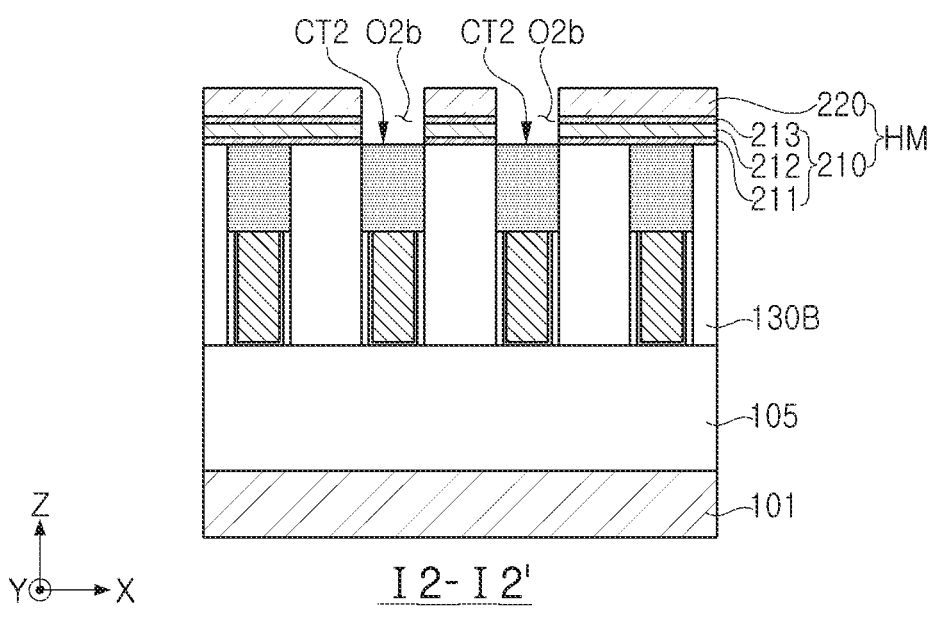

Referring to FIGS. 19A and 19B, a first opening O2a (see FIG. 19A) may be formed in a first region (see FIG. 19A) of the hardmask layer HM using the first stacked mandrel pattern CLA and the first mandrel line 240A, and a second opening O2b may be formed in a second region (see FIG. 19B) of the hardmask layer HM using the second stacked mandrel pattern CLB and the second mandrel line 240B. A process of forming the first opening O2a and a process of forming the second opening O2b may be simultaneously performed using a photolithography process (see FIGS. 9A and 9B and FIGS. 10A and 10B).

Figure 20A:
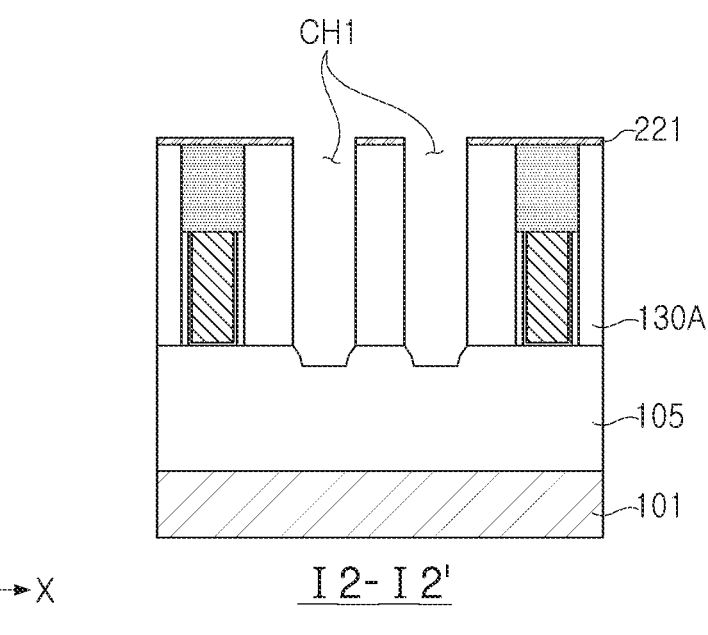
Figure 20B:
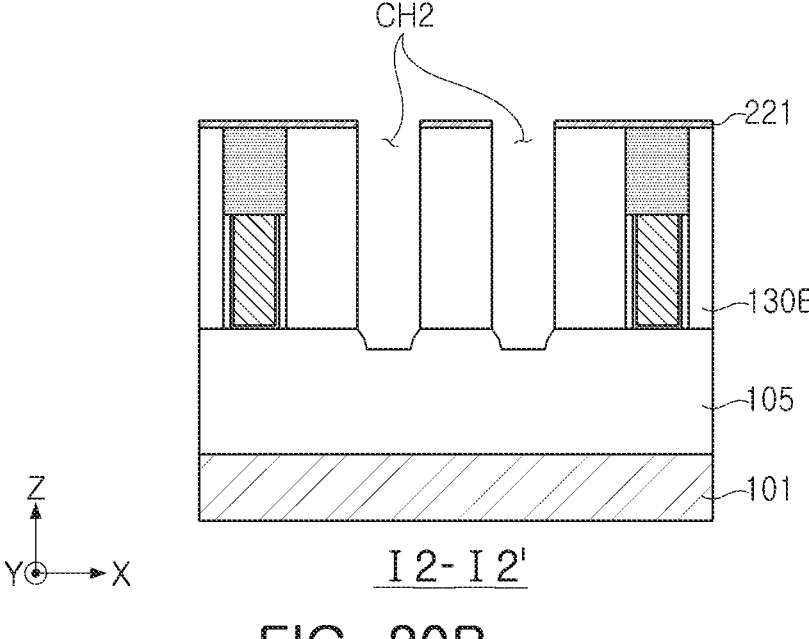

Referring to FIGS. 20A and 20B, the cut region CT may be removed from the first and second gate lines GLA and GLB using the hardmask layer HM to form first and second gate separation holes CH1 and CH2.

Mask patterns having different widths d3a and d3b, for example, first and second composites mandrel patterns CLA and CLB, may be formed in regions corresponding to the first and second intergate insulating portions 130A and 130B having different widths W3a and W3b, respectively. As described above, a mask pattern having a width corresponding to the width of the first and second intergate insulating portions 130A and 130B may be provided using even a single gate-cut process on the first and second regions, in which pitches of gate lines are different from each other, to significantly reduce loss caused by etching during formation of a gate separation hole.

After the first and second gate separation holes CH1 and CH2 are formed, insulating material may fill the first and second gate separation holes CH1 and CH2 to form first and second gate separation patterns 160A and 160B. The insulating material, filling the first and second gate separation holes CH1 and CH2 to form the first and second gate separation patterns 160A and 160B, may include an insulating material different from that of the interlayer insulating layer 130.

In the method of manufacturing a semiconductor device according to an example embodiment, loss of an interlayer insulating layer (or the first and second intergate insulating portions 130A and 130B) around the first and second gate separation patterns 160A and 160B may be significantly reduced using a self-aligned patterning process. The first and second intergate insulating portions 130A and 130B may be blocked by mask patterns having widths corresponding to different widths to significantly reduce loss caused by etching in the first and second intergate insulating portions 130A and 130B adjacent to the first and second gate separation patterns 160A and 160B.

As described above, example embodiments provide a measure to perform a gate line cut process, which may reduce loss of an interlayer insulating layer using a self-aligned patterning process, in a process of manufacturing a semiconductor device including a plurality of gate lines formed by a replacement metal gate (RMG) process.

For example, even when pitches of gate lines are different from each other, a mask pattern having a width to block an interlayer insulating layer having a different width may be formed to significantly reduce loss of the interlayer insulating layer around a gate separation region and to effectively limit and/or prevent a defect from occurring during formation of a contact structure.

While example embodiments have been shown and described above, it will be apparent to those skilled in the art that modifications and variations could be made without departing from the scope of inventive concepts as defined by the appended claims.

What is claimed is:

1. A method of manufacturing a semiconductor device, the method comprising:
providing a semiconductor structure including a plurality of active regions extending on a substrate in a first direction, a plurality of gate lines extending in a second direction that intersects the plurality of active regions, and an interlayer insulating layer around the plurality of gate lines,
the interlayer insulating layer having a plurality of intergate insulating portions that respectively extend in the second direction between the plurality of gate lines;
forming a hardmask layer on the plurality of gate lines and the interlayer insulating layer;
respectively forming mandrel lines on regions of the hardmask layer corresponding to every other one of the plurality of intergate insulating portions, a width of each of the mandrel lines corresponding to a width of the plurality of intergate insulating portions;
conformally forming a spacer material layer on the mandrel lines and an upper surface of the hardmask layer,
the spacer material layer including first portions on sidewalls of the mandrel lines, second portions on an upper surface of the mandrel lines, and third portions on an upper surface region of the hardmask layer between the first portions of the spacer material layer, and
a width of each of the first portions of the spacer material layer corresponding to a width of the plurality of gate lines;
forming a mandrel material layer on the spacer material layer;
etching back part of the mandrel material layer to expose the first portions of the spacer material layer and the second portions of the spacer material layer, while leaving with a remaining portion of the mandrel material layer covering the third portions of the spacer material layer;
removing the first portions of the spacer material layer and the second portions of the spacer material layer from the spacer material layer but leaving stacked mandrel patterns and the mandrel lines on the hardmask layer afterwards, wherein
the stacked mandrel patterns include the remaining portion of the mandrel material layer covering the third portions of the spacer material layer;
forming an opening in the hardmask layer using the mandrel lines and the stacked mandrel patterns as an etch resistant mask structure, the opening exposing a gate-cut region of the plurality of gate lines; and
removing the gate-cut region using the hardmask layer as a mask pattern to form a gate separation hole.

2. The method of claim 1, wherein:
the stacked mandrel patterns are on corresponding intergate insulating portions, which are between the mandrel lines, among the plurality of intergate insulating portions.

3. The method of claim 1, further comprising:
forming a gate separation pattern by filling the gate separation hole with an insulating material.

4. The method of claim 3, wherein
a material included in the interlayer insulating layer is different than the insulating material in the gate separation pattern.

5. The method of claim 1, wherein:
the conformally forming the spacer material layer is performed using atomic layer deposition (ALD).

6. The method of claim 1, wherein
the forming the mandrel material layer includes forming the mandrel material layer to have a planar upper surface.

7. The method of claim 1, wherein
at least one of the mandrel lines and the mandrel material layer includes amorphous silicon.

8. The method of claim 1, wherein
the mandrel lines and the mandrel material layer include a same material.

9. The method of claim 1, wherein
a height of the stacked mandrel patterns is greater than a height of the mandrel lines.

10. The method of claim 1, wherein
the forming the opening in the hardmask layer exposes a plurality of gate-cut regions adjacent to each other in the first direction, and
the gate-cut region is among the plurality of gate-cut regions.

11. The method of claim 1, wherein:
the forming the hardmask layer includes forming a first hardmask and a second hardmask sequentially disposed on the plurality of gate lines and the interlayer insulating layer; and the mandrel lines and
the mandrel material layer has etch selectivity with respect to a material in the second hardmask.

12. The method of claim 1, wherein
the plurality of gate lines each include a gate insulating layer, a gate electrode on the gate insulating layer, and a gate capping layer on the gate electrode.

13. The method of claim 12, wherein:
the hardmask layer includes a first masking layer, a second masking layer, and a third masking layer,
the first masking layer is on the plurality of gate lines and the interlayer insulating layer and includes a first material,
the second masking layer is on the first masking layer and includes a second material, and
the third masking layer is on the second masking layer and includes a third material.

14. The method of claim 13, wherein:
the removing the gate-cut region includes removing an exposed portion of the gate capping layer using the third masking layer as a masking structure,
oxidizing an exposed portion of the gate electrode to provide an oxidized portion of the gate electrode, and
removing the oxidized portion using the second masking layer as a masking pattern.

15. A method of manufacturing a semiconductor device, the method comprising:
providing a semiconductor structure including a plurality of active regions extending on a substrate in a first direction, a plurality of gate lines extending in a second direction that intersects the plurality of active regions, and a plurality of intergate insulating portions that respectively extend in the second direction between the plurality of gate lines,
the plurality of intergate insulating portions including a plurality of first intergate insulating portions and a plurality of a second intergate insulating portions, the plurality of first intergate insulating portions being disposed in a first region of the substrate and each have a first width, the plurality of second intergate insulating portions being disposed in a second region of the substrate and each having a second width, and the second width being greater than the first width;
forming a hardmask layer on the plurality of gate lines and the plurality of intergate insulating portions;
respectively forming first mandrel lines on first regions of the hardmask layer and forming second mandrel lines on second regions of the hardmask layer, the first regions of the hardmask layer corresponding to every other one of the plurality of first intergate insulating portions and the second regions of the hardmask layer corresponding to every other one of the plurality of second intergate insulating portions, a width of each of the first mandrel lines and a width of each of the second mandrel lines corresponding to a width of the plurality of first intergate insulating portions and a width of the plurality of second intergate insulating portions;
conformally forming a spacer material layer on the hardmask layer on which the first mandrel lines and the second mandrel lines are formed,
the spacer material layer including first portions on sidewalls of the first mandrel lines and sidewalls of the second mandrel lines, second portions on an upper surface of the first mandrel lines and an upper surface of the second mandrel lines, and third portions on an upper surface region of the hardmask layer between the first portions of the spacer material layer,
and a width of each of the first portions of the spacer material layer corresponding to a width of the plurality of gate lines;
forming a mandrel material layer on the spacer material layer;
etching back part of the mandrel material layer to expose the first portions of the spacer material layer and the second portions of the spacer material layer;
removing the first portions of the spacer material layer and the second portions of the spacer material layer from the spacer material layer, wherein first stacked mandrel patterns remain on the first regions of the hardmask layer afterwards, wherein second stacked mandrel patterns remain on the second regions of the hardmask layer afterwards, wherein the first mandrel lines and the second mandrel lines remain on the hardmask layer afterwards, and wherein the first stacked mandrel patterns and the second stacked mandrel patterns each include a remaining portion of the mandrel material layer covering the third portions of the spacer material layer;
forming an opening in the hardmask layer using the first mandrel lines, the second mandrel lines, the first stacked mandrel patterns, and the second stacked mandrel patterns as an etch resistant mask structure, the opening exposing an gate-cut regions of the plurality of gate lines; and
removing the gate-cut regions using the hardmask layer as a mask pattern.

16. The method of claim 15, wherein:
the first stacked mandrel patterns are on corresponding first intergate insulating portions, which are between the first mandrel lines, among the plurality of first intergate insulating portions, and
the second stacked mandrel patterns are on corresponding second intergate insulating portions, which are between the second mandrel lines, among the plurality of second intergate insulating portions.

17. The method of claim 15, wherein:
a width of the first stacked mandrel patterns corresponds to the first width, and
a width of the second stacked mandrel patterns corresponds to the second width.

18. A method of manufacturing a semiconductor device, the method comprising:
providing a semiconductor structure including a plurality of gate lines and a plurality of intergate insulating portions, respectively extending in a first direction and alternately arranged in a second direction, the second direction intersecting the first direction;

forming a hardmask layer on the plurality of gate lines and the plurality of intergate insulating portions;

respectively forming mandrel lines on regions of the hardmask layer corresponding to every other one of the plurality of intergate insulating portions, a width of each of the mandrel lines corresponding to a width of the plurality of intergate insulating portions;

conformally forming a spacer material layer on the hardmask layer and the mandrel lines, a thickness of the spacer material layer corresponding to a width of the plurality of gate lines;

forming a mandrel material layer on the spacer material layer;

removing a portion of the mandrel material layer to expose portions of the spacer material layer that are on an upper surface of the mandrel lines and a side surface of the mandrel lines, wherein the removed portion of the mandrel material layer exposes portions of the spacer material layer;

removing the exposed portions of the spacer material layer from the spacer material layer while leaving stacked mandrel patterns and the mandrel lines on the hardmask layer afterwards, each of the stacked mandrel patterns including a residual spacer material layer portion from the spacer material layer and a portion of the mandrel material layer on the residual spacer material layer portion;

forming an opening in the hardmask layer using the mandrel lines and the stacked mandrel patterns as an etch resistant mask structure, the opening exposing a gate-cut region of the plurality of gate lines; and removing the gate-cut region using the hardmask layer as a mask pattern.

19. The method of claim 18, wherein each of the stacked mandrel patterns is on a corresponding intergate insulating portion, which is between the mandrel lines, among the plurality of intergate insulating portions, and each of the stacked mandrel patterns has a width corresponding to a width of the corresponding intergate insulating portion.

20. The method of claim 18, further comprising:

forming a gate separation pattern by filling a gate separation hole with an insulating material, wherein a material in the plurality of intergate insulating portions is different than the insulating material in the gate separation pattern.

\* \* \* \* \*